(12) United States Patent
Matsui

(10) Patent No.: US 7,043,652 B2
(45) Date of Patent: May 9, 2006

(54) CALIBRATION METHOD AND MEMORY SYSTEM

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 645 days.

(21) Appl. No.: 10/210,406

(22) Filed: Aug. 1, 2002

(65) Prior Publication Data

US 2003/0026162 A1 Feb. 6, 2003

(30) Foreign Application Priority Data

Aug. 3, 2001 (JP) ............................. 2001-236759

(51) Int. Cl.
*G06F 12/00* (2006.01)
(52) U.S. Cl. ...................... 713/400; 713/401; 713/500; 713/501; 713/502; 713/503
(58) Field of Classification Search ........ 713/500–503, 713/400–401, 600
See application file for complete search history.

(56) References Cited

U.S. PATENT DOCUMENTS

| | | | | |
|---|---|---|---|---|
| 5,892,719 A * | 4/1999 | Kanagawa | ................... | 365/200 |
| 5,995,430 A * | 11/1999 | Yabe | .......................... | 365/203 |
| 6,081,477 A * | 6/2000 | Li | ............................. | 365/233 |
| 6,154,418 A * | 11/2000 | Li | ............................. | 365/233 |
| 6,442,102 B1 * | 8/2002 | Borkenhagen et al. | ...... | 365/233 |
| 6,691,214 B1 * | 2/2004 | Li et al. | ..................... | 711/167 |
| 6,704,881 B1 * | 3/2004 | Li et al. | ..................... | 713/401 |
| 6,760,856 B1 * | 7/2004 | Borkenhagen et al. | ...... | 713/401 |
| 6,845,460 B1 * | 1/2005 | Lee et al. | ................... | 713/401 |
| 6,877,079 B1 * | 4/2005 | Yoo et al. | ................... | 711/167 |
| 6,889,336 B1 * | 5/2005 | Schoenfeld et al. | ........ | 713/503 |

FOREIGN PATENT DOCUMENTS

| | | |
|---|---|---|
| JP | 11-007335 | 1/1999 |
| JP | 11-039869 | 2/1999 |
| JP | 11-167515 | 6/1999 |
| JP | 2000-148656 | 5/2000 |
| JP | 2002-082830 | 3/2002 |
| JP | 2002-531966 | 9/2002 |
| WO | WO 00/33200 | 6/2000 |

OTHER PUBLICATIONS

Japanese Office Action dated Sep. 22, 2004.
SLDRAM Inc. SLD4M18DR400 4 MEG X 18 SLDRAM Datasheet. 1998, p. 1-14.

* cited by examiner

*Primary Examiner*—A. Elamin
(74) *Attorney, Agent, or Firm*—Katten Muchin Rosenman LLP

(57) ABSTRACT

In a memory system having a memory controller 20 and at least one DRAM 30, the memory controller 20 receives a continuous and alternate inversion signal as a pseudo clock signal from the DRAM 30, and generates an internal reception clock signal for a DQ signal on the basis of the continuous and alternate inversion signal and a base clock signal. Then, the memory controller 20 counts the number of the receiving internal clocks from the moment an OUT1 command is issued to the DRAM 30 until a high-level data signal is received as the DQ data signal from the DRAM 30, and retains the count result as the number of delay clocks. Thus, the memory controller 20 can receive read data (DQ signal) on the basis of the internal reception clock signal when time equivalent to the number of the delay clocks passes after the read command is issued.

49 Claims, 23 Drawing Sheets

|          | DQ0 | DQ1 | DQ2 | DQ3 | DQ4 | DQ5 | DQ6 | DQ7 |
|----------|-----|-----|-----|-----|-----|-----|-----|-----|
| COMBINATION OF DATA | 0 | 1 | 0 | 1 | 0 | 1 | 0 | 1 |
|          | 1 | 0 | 1 | 0 | 1 | 0 | 1 | 0 |

FIG. 3

CALIBRATION METHOD AND MEMORY SYSTEM

BACKGROUND OF THE INVENTION

The present invention relates to a memory system and, more particularly, to a memory system capable of restraining a reduction in a receiving margin at a signal receiving side even at high frequencies.

As well known, in a DRAM system, signal transmission carried out on a bus between a memory controller and each DRAM inevitably incurs delays attributable to influences on a bus, a substrate, and the like, such as wiring capacitor, parasitic capacitor.

Recently, as the data rate of a DRAM is becoming higher and higher, a proportion of the signal propagation delay in the operation cycle is increasing. To cope with this trend, a proposal has been made about restraining that reduction of a signal receiving margin which is caused by the propagation delay. For example, the cycle time of a system operated at a clock of 400 MHz is 2.5 ns, while the propagation delay of a DQ signal between memory controller DRAMs reaches 1.6 ns.

Practically, DRAM systems have been known which transmit and receive data at both leading and trailing edges of a clock signal. In this case, a cycle time of one bit is virtually as short as 1.25 ns, which makes it impossible to match or adjust bi-directional data between a DRAM and a memory controller by using only a unidirectional clock signal.

Hence, there has been proposed a memory system which separately has a write clock and a read clock. In this memory system, data timing is adjusted or matched to the write clock in writing data from the memory controller to the DRAM. On the other hand, the data timing is matched to the read clock in reading data out of the DRAM to the memory controller, as shown in FIG. 22 (will be hereinafter referred to as "related technology 1").

As mentioned above, the memory system according to the related technology 1 requires two phases of clock signals for readout and write-in operation.

The configuration of a DQ in this related technology 1 is equivalent to the bit configuration of a discrete DRAM, and has a bit width of 4/8/16, etc. It is expected in the future that there will be a demand for a further higher data transfer speed. To meet such a demand, a further expanded bit width will be required.

FIG. 23 shows a memory system in which the DQ bit width in the related technology 1 has been expanded (hereinafter referred to as "related technology 2"). The related technology 2 relates to a memory system equipped with a plurality of memory modules on which a plurality of memory devices are mounted. In this related technology 2, however, the number of write clocks and read clocks must be increased as the number of parallel DRAMs. This memory system has a shortcoming in that the number of clock lines of the entire system increases with consequent higher cost of the system.

There is another problem in that the timing margin on a receiving side reduces due to a difference between a DQ signal and a clock signal in signal propagation time attributable to a wiring layout, signal drivability, the difference in electrical termination method, etc. in a system.

SUMMARY OF THE INVENTION

It is an object of the present invention to propose a memory system that has been improved to solve the problems described above.

According to the present invention, in order to solve the problems described above, when a signal is transmitted or received on a predetermined signal path in a system wherein a transmitting apparatus and a receiving apparatus operate on the basis of a single reference or base clock signal, an internal clock signal for receiving a signal that takes into account the propagation delay of a signal on a predetermined signal path in a receiving apparatus is generated, and the signal is received through the predetermined signal path on the basis of the internal reception clock signal. Specifically, a continuous and alternate inversion signal (pseudo clock signal) having the same cycle as the reference or base clock signal is at first transmitted from the transmitting apparatus toward the receiving apparatus through a predetermined signal transmitting path. The receiving apparatus generates an internal clock signal in response to the continuous and alternate inversion signal. The continuous and alternate inversion signal will impliedly deliver, by its propagation, the propagation delay on the signal transmission path to the receiving apparatus, so that the internal clock signal generated based thereon will take the propagation delay on the signal transmission path into account. This solves the problem in that the timing margin for receiving signals in the receiving apparatus decreases. Regarding the memory system, such a concept can be applied to a case where the transmitting apparatus is the memory controller and the receiving apparatus is a memory device, and also to a case where the transmitting apparatus is the memory device and the receiving apparatus is the memory controller.

To be more specific, as the means for solving the problems described above, the present invention provides the calibration methods and memory systems enumerated below.

According to the present invention, there is provided a first calibration method for a memory controller to properly receive a DQ signal from a semiconductor memory device in a memory system adapted to perform signal transmission between the semiconductor memory device and the memory controller in conformity with a base clock signal, comprising:

a first step wherein the semiconductor memory device transmits a continuous and alternate inversion signal (may be simply called continuous inversion signal) as an initializing DQ signal to a DQ bus by adjusting to a predetermined base clock signal phase according to the base clock signal; and a second step wherein the memory controller generates an internal clock signal for receiving such that it has a predetermined phase difference with respect to the initializing DQ signal that has been received, wherein the memory controller receives a DQ signal from the semiconductor memory device on the basis of the internal clock signal for receiving.

According to the present invention, there is provided a second calibration method in which the second step is implemented by using a DLL circuit, and the phase difference between the internal clock signal for receiving and the base clock signal in the memory controller is retained in the DLL circuit thereby to maintain the generation of the internal clock signal for receiving by the DLL circuit in the first calibration method.

According to the present invention, there is provided a third calibration method in which the first step uses a particular single DQ line among DQ lines constituting the DQ bus to mutually transmit a continuous inversion signal to the particular single DQ line, and the second step generates the internal clock signal for receiving on the basis of the continuous inversion signal in the first or second calibration method.

According to the present invention, there is provided a fourth calibration method in which the first step transmits the continuous inversion signal to the particular single DQ line, and drives the DQ lines constituting the DQ bus other than the particular single DQ line such that the signals transmitted to adjoining DQ lines are inverted to each other in the third calibration method.

According to the present invention, there is provided a fifth calibration method in which the first step uses two particular DQ lines among DQ lines constituting the DQ bus to transmit mutually complementary continuous inversion signals to the particular two DQ lines, and the second step generates the internal clock signal for receiving on the basis of the complementary continuous inversion signal in the first or second calibration method.

According to the present invention, there is provided a sixth calibration method in which the second step transmits the complementary continuous inversion signals to the particular two DQ lines among the DQ lines constituting the DQ bus, and drives the DQ lines other than the particular two DQ lines such that the signals transmitted to adjoining DQ lines are inverted against each other in the fifth calibration method.

According to the present invention, there is provided a seventh calibration method further comprising, in the first calibration method:

a third step wherein the memory controller issues a reference DQ data output instruction to the semiconductor memory device;

a fourth step wherein the semiconductor memory device transmits a reference DQ data signal associated with the reference DQ data output instruction to a DQ bus; and a fifth step wherein the memory controller counts the number of clocks until the memory controller receives the reference DQ data signal by the internal clock signal for receiving, and retains the count result as the number of delay clocks.

According to the present invention, there is provided an eighth calibration method in which the memory controller receives the DQ signal transmitted to a DQ bus from the semiconductor memory device by the internal clock signal for receiving, considering the number of delay clocks, in the seventh calibration method.

According to the present invention, there is provided a ninth calibration method for a semiconductor memory device to properly receive a DQ signal from a memory controller in a memory system adapted to perform signal transmission between the semiconductor memory device and the memory controller on the basis of a base clock signal, comprising:

a first step wherein the memory controller transmits a continuous inversion signal as an initializing DQ signal to a DQ bus by adjusting to a predetermined base clock signal phase; and a second step wherein the semiconductor memory device generates an internal clock signal for receiving such that it has a predetermined phase difference with respect to the initializing DQ signal that has been received, wherein the semiconductor memory device receives a DQ signal from the memory controller on the basis of the internal clock signal for receiving.

According to the present invention, there is provided a tenth calibration method in which the second step is implemented by using a DLL circuit, and the phase difference between the internal clock signal for receiving and the base clock signal in the semiconductor memory device is retained in the DLL circuit thereby to maintain the generation of the internal clock signal for receiving by the DLL circuit in the ninth calibration method.

According to the present invention, there is provided an eleventh calibration method in which the first step uses a particular single DQ line among DQ lines constituting the DQ bus to mutually transmit a continuous inversion signal to the particular single DQ line, and the second step generates the internal clock signal for receiving on the basis of the continuous inversion signal in the ninth or tenth calibration method.

According to the present invention, there is provided a twelfth calibration method in which the first step transmits the continuous inversion signal to the particular single DQ line, and drives the DQ lines constituting the DQ bus other than the particular single DQ line such that the signals transmitted to adjoining DQ lines are inverted to each other in the eleventh calibration method.

According to the present invention, there is provided a thirteenth calibration method in which the first step uses two particular DQ lines among DQ lines constituting the DQ bus to transmit mutually complementary continuous inversion signals to the particular two DQ lines, and the second step generates the internal reception clock signal on the basis of the complementary continuous inversion signal in the ninth or tenth calibration method.

According to the present invention, there is provided a fourteenth calibration method in which the second step transmits the complementary continuous inversion signals to the particular two DQ lines among the DQ lines constituting the DQ bus, and drives the DQ lines other than the particular two DQ lines such that the signals transmitted to adjoining DQ lines are inverted against each other in the thirteenth calibration method.

According to the present invention, there is provided a fifteenth calibration method further comprising, in the ninth calibration method:

a third step wherein the memory controller issues a reference DQ data output instruction to the semiconductor memory device;

a fourth step wherein the semiconductor memory device transmits a reference DQ data signal associated with the reference DQ data output instruction to a DQ bus; and a fifth step wherein the memory controller counts the number of clocks until the memory controller receives the reference DQ data signal on the basis of the base clock signal, and retains the count result as the number of delay clocks, wherein the memory controller receives, after issuing a read command, read data associated with the read command as a DQ signal from the semiconductor memory device according to the base clock signal, taking the number of the delay clocks into account.

According to the present invention, there is provided a sixteenth calibration method comprising, in the ninth calibration method:

a third step in which the memory controller transmits a continuous inversion signal as an initializing command/address signal to a command/address bus by adjusting to a predetermined base clock signal phase; and a fourth step in which the semiconductor memory device generates an internal reception clock signal of the command/ address signal such that it has a predetermined phase difference with respect to the initializing command signal or the initializing address signal that has been received, wherein the semiconductor memory device receives a command/address signal from the memory controller on the basis of the internal reception clock signal of the command/address signal.

According to the present invention, there is provided a seventeenth calibration method wherein the fourth step is implemented by using a DLL circuit, and the phase difference between the internal reception clock signal of the command/address signal and the base clock signal in the semiconductor memory device is retained in the DLL circuit thereby to maintain the generation of the internal reception clock signal for the command/address signal.

According to the present invention, there is provided an eighteenth calibration method wherein the third step uses two particular command/address signal lines among command/address signal lines constituting the command/address bus to transmit mutually complementary continuous inversion signals to the two command/address signal lines, and the fourth step generates internal clock signals for receiving for the command/address signal lines on the basis of the complementary continuous inversion signals in the sixteenth calibration method.

According to the present invention, there is provided a nineteenth calibration method further comprising, in the sixteenth calibration method:

a fifth step in which the memory controller issues a reference DQ data output instruction to the semiconductor memory device;

a sixth step in which the semiconductor memory device transmits a reference DQ data signal associated with the reference DQ data output instruction to a DQ bus; and a seventh step in which the memory controller counts the number of clocks until the reference DQ data signal is received according to the base clock signal, and retains the count result as the number of delay clocks, wherein the memory controller issues a read command, then receives, from the semiconductor memory device, read data associated with the read command as a DQ signal according to the base clock signal, considering the number of delay clocks.

According to the present invention, there is provided memory systems shown below as the memory systems that allow the aforesaid calibration methods to be implemented.

According to the present invention, there is provided a first memory system adapted to perform signal transmission between a semiconductor memory device and a memory controller on the basis of a base clock signal, wherein the semiconductor memory device comprises an initializing DQ signal transmitting means for transmitting a continuous inversion signal as an initializing DQ signal to a DQ bus by adjusting to a predetermined base clock signal phase on the basis of a base clock signal, and the memory controller comprises a receiving internal clock signal generating means for generating an internal reception clock signal such that it has a predetermined phase difference with respect to the initializing DQ signal that has been received, and receives a DQ signal from the semiconductor memory device on the basis of the internal reception clock signal.

According to the present invention, there is provided a second memory system wherein the internal reception clock signal generating means comprises a phase difference retaining means for retaining a phase difference between the internal reception clock signal and the base clock signal in the memory controller, and is able to continue to generate the internal reception clock signal from the base clock signal on the basis of a phase difference retained in the phase difference retaining means in the first memory system.

According to the present invention, there is provided a third memory system wherein the initializing DQ signal transmitting means uses two particular DQ lines among DQ lines constituting the DQ bus to transmit mutually complementary continuous inversion signals as the initializing DQ signals, and the receiving internal clock generating means receives the initializing DQ signals that are the complementary continuous inversion signals through the two particular DQ lines, and generates the internal reception clock signal on the basis of the initializing DQ signals in the first or second memory system.

According to the present invention, there is provided a fourth memory system wherein the memory controller further comprises a DQ data output instruction means for issuing a reference DQ data output instruction to the semiconductor memory device after generating the internal reception clock signal, and a delay clock number retaining means for counting the number of clocks until a reference DQ data signal that corresponds to the reference DQ data output instruction is received from the semiconductor memory device according to the internal reception clock signal, and retains the count result as the number of delay clocks, and the semiconductor memory device further comprises a data output means for transmitting the reference DQ data signal to a DQ bus in response to the reference DQ data output instruction in the first memory system.

According to the present invention, there is provided a fifth memory system wherein the memory controller receives the DQ signal transmitted to a DQ bus from the semiconductor memory device on the basis of the internal reception clock signal, considering the number of the delay clocks in the fourth memory system.

According to the present invention, there is provided a sixth memory system wherein a clock signal line for transmitting a base clock signal is provided for each DQ line for each byte or word in any one of the first to fifth memory system.

According to the present invention, there is provided a seventh memory system comprising a parity DQ bit line for each byte in the sixth memory system.

According to the present invention, there is provided an eighth memory system adapted to perform signal transmission between a semiconductor memory device and a memory controller on the basis of a base clock signal, wherein the memory controller comprises an initializing DQ signal transmitting means for transmitting a continuous inversion signal as an initializing DQ signal to a DQ bus by adjusting to a predetermined base clock signal phase, and the semiconductor memory device comprises an internal reception clock signal generating means for generating an internal reception clock signal such that it has a predetermined phase difference with respect to the initializing DQ signal that has been received, and receives a DQ signal from the semiconductor memory device on the basis of the internal reception clock signal.

According to the present invention, there is provided a ninth memory system wherein the internal reception clock signal generating means comprises a phase difference retaining means for retaining a phase difference between the internal reception clock signal and the base clock signal in the semiconductor memory device, and is able to continue to generate the internal reception clock signal from the base clock signal on the basis of a phase difference retained in the phase difference retaining means in the eighth memory system.

According to the present invention, there is provided a tenth memory system wherein the initializing DQ signal transmitting means uses two particular DQ lines among DQ lines constituting the DQ bus to transmit mutually complementary continuous inversion signals as the initializing DQ signals, and the receiving internal clock generating means receives the initializing DQ signals that are the complementary continuous inversion signals through the two particular DQ lines, and generates the internal reception clock signal on the basis of the initializing DQ signals in the eighth or ninth memory system.

According to the present invention, there is provided an eleventh memory system, wherein the memory controller further comprises a DQ data output instruction means for issuing a reference DQ data output instruction to the semiconductor memory device, and a delay clock number retaining means for counting the number of clocks until the reference DQ data signal that corresponds to the reference DQ data output instruction is received from the semiconductor memory device by the base clock signal, and retains the count result as the number of delay clocks, and the semiconductor memory device further comprises a data output means for transmitting the reference DQ data signal to a DQ bus in response to the reference DQ data output instruction in the eighth memory system.

According to the present invention, there is provided a twelfth memory system wherein the memory controller comprises an initializing CA signal transmitting means for transmitting a continuous inversion signal as an initializing command/address signal to a command/address bus by adjusting to a predetermined base clock signal phase; and the semiconductor memory device comprises a CA internal reception clock signal generating means for generating an internal reception clock signal of the command/address signal such that it has a predetermined phase difference with respect to the initializing command signal or the initializing address signal that has been received, and receives a command/address signal from the memory controller on the basis of the internal reception clock signal of the command/address signal generated by the CA internal reception clock signal generating means in the eighth memory system.

According to the present invention, there is provided a thirteenth memory system wherein the CA internal reception clock signal generating means comprises an additional phase difference retaining means for retaining a phase difference between the internal reception clock signal of the command/address signal and the base clock signal in the semiconductor memory device, and is able to continue to generate the internal reception clock signal of the command/address signal from the base clock signal on the basis of the phase difference retained in the additional phase difference retaining means in the twelfth memory system.

According to the present invention, there is provided a fourteenth memory system wherein the initializing CA signal transmitting means uses two particular command/address signal lines among command/address signal lines constituting the command/address bus to transmit mutually complementary continuous and alternate inversion signals as the initializing command/address signals, and the CA internal reception clock signal generating means receives the initializing command/address signals, which are the complementary continuous and alternate inversion signals, through the two particular command/address signal lines, and generates internal reception clock signal of the command/address signal lines on the basis of the initializing command/address signals in the twelfth or thirteenth memory system.

According to the present invention, there is provided a fifteenth memory system, wherein the memory controller further comprises a DQ data output instruction means for issuing a reference DQ data output instruction to the semiconductor memory device, and a delay clock number retaining means for counting the number of clocks until the reference DQ data signal that corresponds to the reference DQ data output instruction is received from the semiconductor memory device according to the base clock signal, and retains the count result as the number of delay clocks, and the semiconductor memory device further comprises a data output means for transmitting the reference DQ data signal to a DQ bus in response to the reference DQ data output instruction in the twelfth memory system.

According to the present invention, there is provided a sixteenth memory system, wherein the memory controller receives the DQ signal transmitted to a DQ bus from the semiconductor memory device according to the base clock signal, taking the number of the delay clocks into account in the fifteenth memory system.

According to the present invention, there is provided a seventeenth memory system, wherein a clock signal line for transmitting a base clock signal is provided for each DQ line for each byte or word in any one of the eighth to sixteenth memory systems.

According to the present invention, there is provided an eighteenth memory system, comprising a parity DQ bit line for each byte in the seventeenth memory system.

BRIEF DESCRIPTION OF THE DRAWINGS

FIG. 3 is a diagram for explaining the generation of a continuous and alternate inversion signal (pseudo clock signal) according to the first embodiment of the present invention.

DESCRIPTION OF THE PREFERRED EMBODIMENT

Memory systems according to embodiments of the present invention will now be described in detail with reference to the accompanying drawings. The following description will take, as examples, memory systems equipped with DRAM devices as semiconductor memory devices.

EXAMPLE 1

A memory system according to a first embodiment of the present invention is intended to achieve fewer read clocks, as compared with the related technologies described above, and to improve the timing margin for reading by a technique (to be discussed hereinafter) for realizing it.

Figure 1:
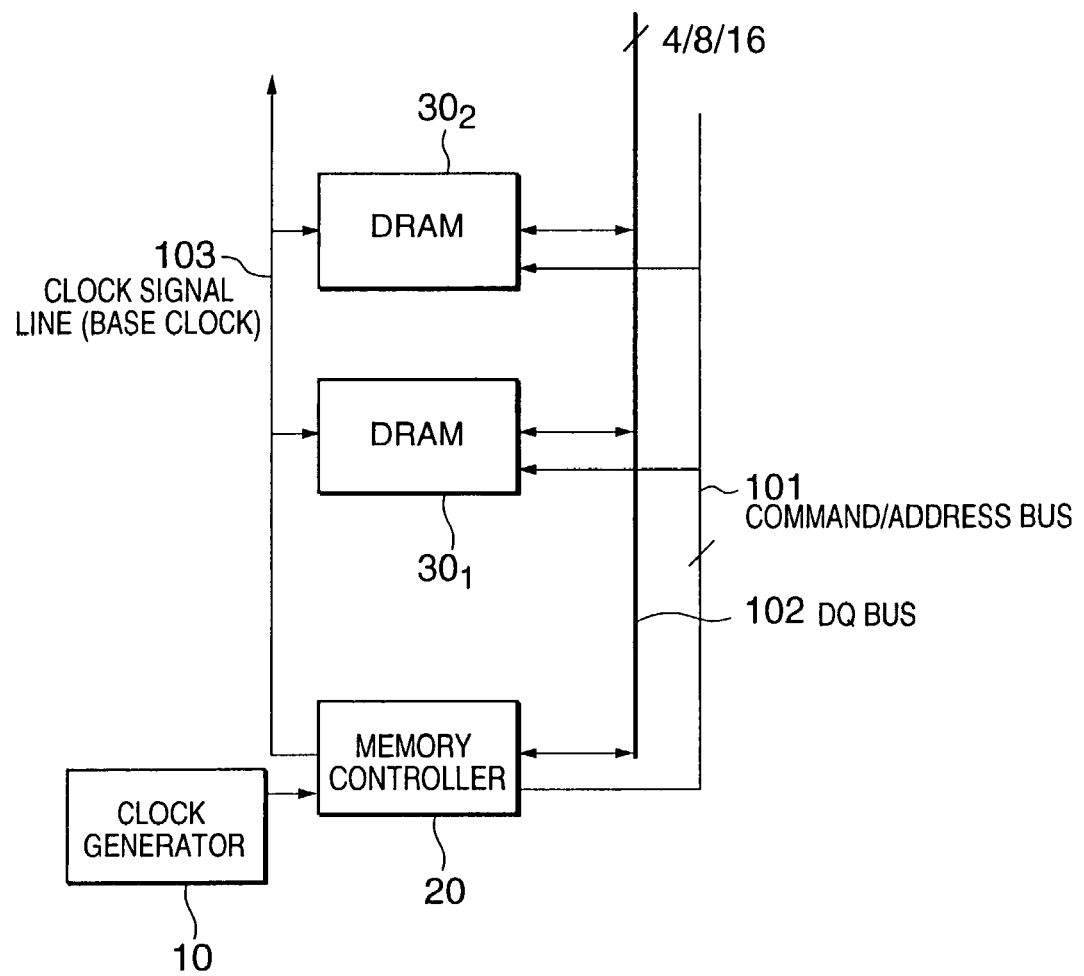
FIG. 1 is a diagram showing a schematic configuration of a memory system according to a first embodiment of the present invention.

The memory system according to this embodiment is provided with a clock generator 10, a memory controller (MC) 20, and DRAMs 30$_1$ and 30$_2$, as shown in FIG. 1. Provided between the memory controller 20 and the DRAMs 30$_1$ and 30$_2$ are a command/address bus 101 for transmitting a command/address signal from the memory controller 20 to the DRAMs 30$_1$ and 30$_2$, a DQ bus 102 for transferring a DQ signal between the memory controller 20 and the DRAMs 30$_1$ and 30$_2$, and a clock signal line 103 for transmitting a base clock signal from the memory controller 20 to the DRAMs 30$_1$ and 30$_2$.

As is obvious from FIG. 1, in this embodiment, the memory controller 20 and the DRAMs 30$_1$ and 30$_2$ operate on the basis of the single base clock signal. The base clock signal is generated by the memory controller 20 according to a clock supplied from the clock generator 10, and input to the DRAMs 30$_1$ and 30$_2$ via the clock signal line 103. Write data is propagated in the same direction as the base clock signal, so that it is matched to the base clock signal and transmitted to the DRAMs 30$_1$ and 30$_2$ from the memory controller 20 via the DQ bus 102. The DRAMs 30$_1$ and 30$_2$ receive the write data (DQ signal) by using the base clock signal.

The read data read out from the DRAMs 30$_1$ and 30$_2$ is timed to the base clock signal and output from the DRAMs 30$_1$ and 30$_2$. However, the propagating direction of the base clock signal is opposite from the propagating direction of the read data read from the DRAMs 30$_1$ and 30$_2$, and a propagation delay is produced on the DQ bus 102 or the like in the course from the DRAMs 30$_1$ and 30$_2$ to the memory controller 20. Hence, the memory controller 20 cannot properly receive the read data (DQ signal) in terms of the base clock signal itself.

Accordingly, in this embodiment, an internal reception clock signal at the memory controller 20 side is generated in the memory controller 20 according to a first initializing procedure described below, and the read data from the DRAMs 30$_1$ and 30$_2$ is received using the generated internal reception clock signal. In the first initializing procedure, the adjustment of the propagation delay is performed on the basis of the DQ signal itself. Therefore, this embodiment does not incur the reduction in the receiving timing margin attributable to the difference in propagation time between a read clock and the DQ signal, which is a problem in the related technologies previously described.

Figure 2:
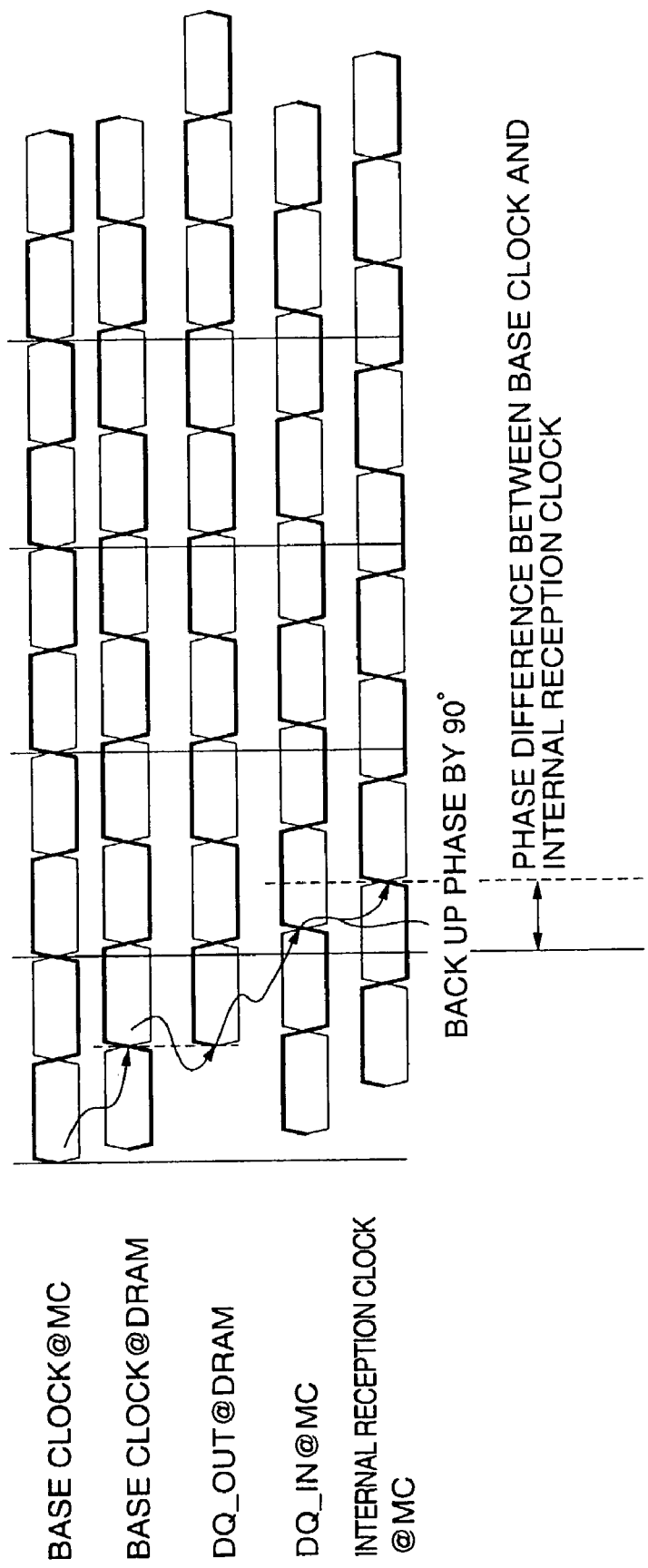
FIG. 2 is a timing chart showing a first initializing procedure in a calibration method according to the first embodiment of the present invention.

Referring also to FIG. 2, the descriptions will now be given of the procedure for generating the internal reception clock signal at the memory controller 20. The internal reception clock signal is generated for each of the DRAMs 30$_1$ and 30$_2$. In the following, the descriptions will be given of the case of the DRAM 30$_2$; however, the same applies to the case of the DRAM 30$_1$.

First, the memory controller 20 issues a first initializing instruction to the DRAM 30$_2$. The DRAM 30$_2$ starts a first initializing operation upon receipt of the first initializing instruction from the memory controller 20 via the command/address bus 101. The DRAM 30$_2$ in the first initializing operation outputs a continuous and alternate inversion signal (may be simply often called continuous inversion signal) matched to an edge of the base clock signal to a particular DQ terminal (refer to base clock@DRAM and DQ_out@DRAM in FIG. 2). As is obvious from FIG. 2, in this embodiment, the output timing of the continuous inversion signal is the same as the timing at which the DRAM $30_2$ ($30_1$) outputs the DQ signal in a normal operation. More specifically, the DRAM $30_2$ outputs the continuous inversion signal at the rise and/or fall of the base clock signal. The memory controller 20 receives the continuous inversion signal as a pseudo clock signal (refer to DQ_in@MC in FIG. 2), and backs up the phase of the received pseudo clock signal (continuous inversion signal) by 90 degrees so as to generate the internal reception clock signal at the memory controller (refer to receiving internal clock@MC in FIG. 2). Thus, the memory controller 20 generates an internal reception clock signal that has a phase optimum for receiving read data (DQ signal) during the normal operation. The memory controller 20 retains the phase difference between the internal reception clock signal and the base clock signal, so that it can maintain the generation of the internal reception clock signal after the first initializing procedure is terminated (after the internal reception clock signal is generated).

In this embodiment, the continuous inversion signals as the pseudo clock signals are transmitted from the DRAM $30_2$ to the memory controller 20 by using two DQ lines among a plurality of DQ lines constituting the DQ bus 102. The continuous inversion signals transmitted over the two DQ lines are complementary to each other. Adopting such two continuous inversion signals as pseudo clock signals allows clocks to be detected on the basis of the cross point thereof, thus making it possible to improve the timing accuracy of generating the internal reception clock signal. It is possible to generate the internal reception clock signal by using a single DQ line and a single continuous inversion signal. In such a case, it is necessary to compare the continuous inversion signal and a reference potential ($V_{REF}$) to identify H/L of the continuous inversion signal as the pseudo clock signal. In this case, if noise fluctuation or the like takes place in the reference potential VREF, then a shift takes place in clock detection, resulting in deteriorated timing accuracy, as compared with the case where the two DQ lines are used as set forth above. Accordingly, for the transmission of continuous inversion signals, it is preferred to use two DQ lines to transmit continuous inversion signals that are complementary to each other.

In the first initializing procedure, the continuous inversion signals are transmitted to tow or one particular DQ lines among the DQ lines making up the DQ bus 102, and based on this, the internal clock signals for receiving DQ signals at the memory controller 20 are generated. However, the propagation of DQ signals during the normal operation is subjected to cross talk from other DQ lines; therefore, it is desirable to take the cross talk also into account. For example, in a case where the DRAM is of an 8-bit design and the DQ lines are laid out as shown in FIG. 3, the DRAM preferably outputs complementary continuous inversion signals to two particular DQ lines (DQ3, DQ4), while it outputs a signal for compensating for cross talk to the remaining DQ lines (DQ0, DQ1, DQ2, DQ5, DQ6, and DQ7). The signals for compensating for cross talk are obtained by checking beforehand, by simulation or the like, to find a combination of data that causes the propagation delay on the DQ lines (DQ3 and DQ4) for transmitting the continuous inversion signals to take a mean value in the normal operation. By outputting the signal for compensating for cross talk to the DQ lines other than the DQ lines that transmit the continuous inversion signals at the same time when the continuous inversion signals are output, the margin of the timing for receiving the DQ signal at the memory controller 20 side can be improved. In this embodiment, as shown in FIG. 3, 0 or 1 is alternately combined and output thereby to render a state wherein cross talk is leveled. More specifically, in this embodiment, the DQ lines other than the two particular DQ lines are driven such that the signals transmitted to adjoining DQ lines are inverted against each other.

Figure 4:
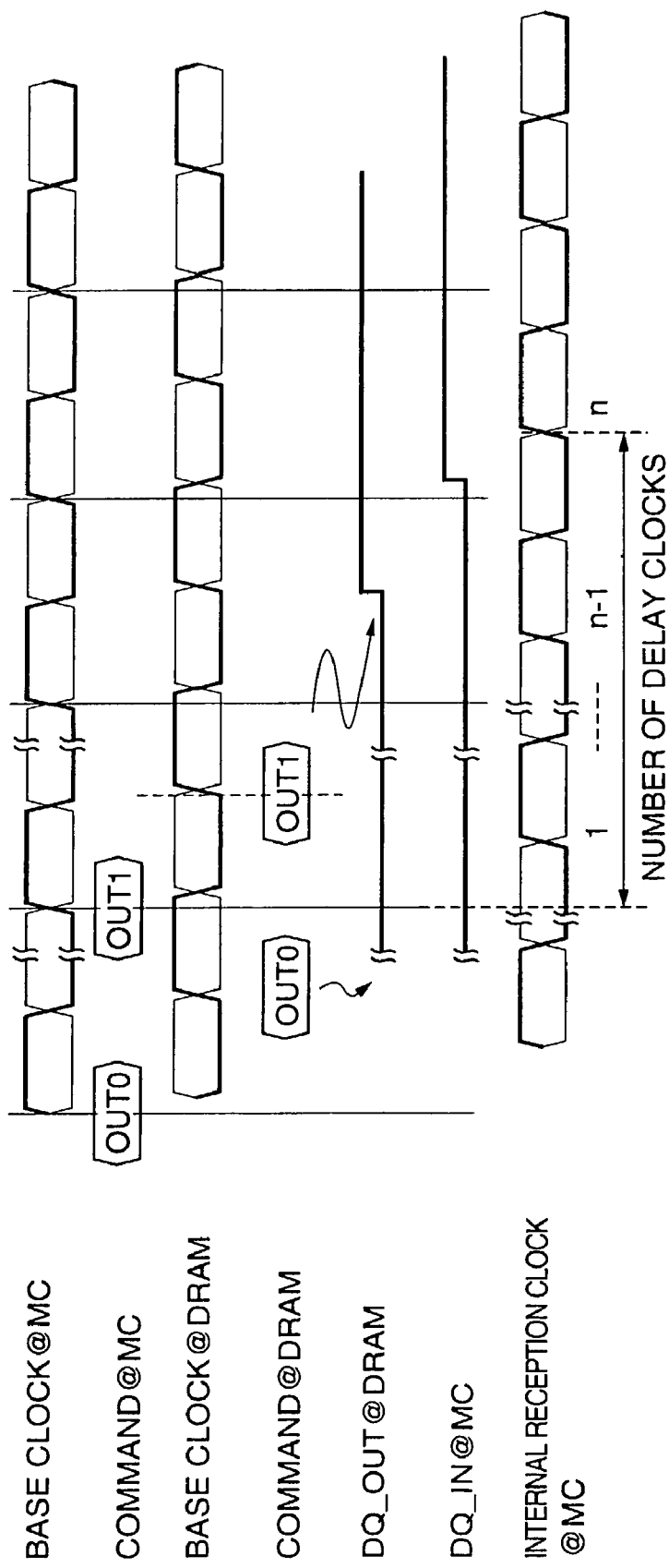
FIG. 4 is a timing chart showing a second initializing procedure in the calibration method according to the first embodiment of the present invention.

After generating the internal reception clock signal for receiving the DQ signals as described above in the first initializing procedure, the memory controller 20 carries out a second initializing procedure as shown in FIG. 4 to acquire a delay time from the issuance of a read command to the receipt of read data.

In the second initializing procedure, the memory controller 20 uses a reference DQ data output instruction (OUT0 command or OUT1 command). The reference DQ data output instruction (OUT0 command or OUT1 command) is a pseudo read command indicative of a low level data output or a high level data output as the reference DQ data. The DRAM $30_2$ outputs the reference DQ data specified by the same clock latency as that in a normal read operation according to the reference DQ data output instruction. In other words, in this embodiment, the number of clocks required from the moment the reference DQ data output instruction is supplied to the DRAM $30_2$ to the moment the associated reference DQ data is output is the same as that in the normal operation.

To be more specific, the memory controller 20 first issues a second initializing instruction to the DRAM $30_2$ by using the command/address bus 101, then it issues the OUT0 command (refer to command@MC in FIG. 4). The second initializing instruction and the OUT0 command are issued such that the rising edge of the base clock signal will be the center of the effective width of the command. Upon receipt of the second initializing instruction, the DRAM $30_2$ moves into a mode for carrying out the second initializing procedure, and outputs low level data onto a DQ line upon receipt of the OUT0 command (refer to command@DRAM and DQ_out@DRAM in FIG. 4). Meanwhile, after outputting the OUT0 command, the memory controller 20 outputs the OUT1 command via the command/address bus 101 (refer to command@MC in FIG. 4). The OUT1 command is also issued such that the rising edge of the base clock signal will be the center of the effective width of the command. In response to the OUT1 command, the DRAM $30_2$ outputs high level data onto a DQ line (refer to command@DRAM and DQ_out@DRAM in FIG. 4). The memory controller 20 monitors the level of the data transmitted to the DQ lines to detect the point at which the level is switched from low to high, thereby finding the moment the reference DQ data associated with the OUT1 command arrives (refer to DQ_in@MC in FIG. 4). Thus, the memory controller 20 counts the number of clocks of the internal clock signals for receiving from the issuance of the OUT1 command to the receipt of high level data via a DQ line, and retains the count result as the number of delay clocks (refer to the receiving internal clock@MC in FIG. 4).

By the time the first and second initializing procedures explained above are completed, the memory controller 20 will hold the phase difference between the internal reception clock signal for the DRAM $30_2$ and the base clock signal along with the number of delay clocks. Therefore, to read data from the DRAM $30_2$, the read data associated with the read command can be properly received by adjusting to the internal reception clock signal generated by utilizing the aforesaid phase difference at the moment the number of delay clocks is reached after the read command was issued.

In addition, the memory controller 20 carries out the above first and second initializing procedures explained in conjunction with the DRAM 30₂ on all DRAMs (30₁) connected to the DQ bus 102, and retains the phase differences between the internal reception clock signal and the base clock signal and the number of delay clocks of each DRAM. This allows proper reception of read data from all DRAMs.

Of the initializing procedures discussed above, the second initializing procedure is dispensable in a case where the time required from the moment the read command is issued from the memory controller to the moment the read data associated with the command is received by the memory controller can be accurately known in advance by, for example, simulation or the like. More specifically, in such a case, the propagation delay or the number of clocks corresponding to the above number of delay clocks is acquired beforehand by simulation or the like, and retained in the memory controller. After the first initializing procedure is carried out, on the basis of the internal reception clock signal, a DQ signal is received at the point where the propagation delay or the number of clocks, which has been acquired in advance, is reached after the issuance of the read command. This allows data from a DRAM to be properly read.

Figure 5:
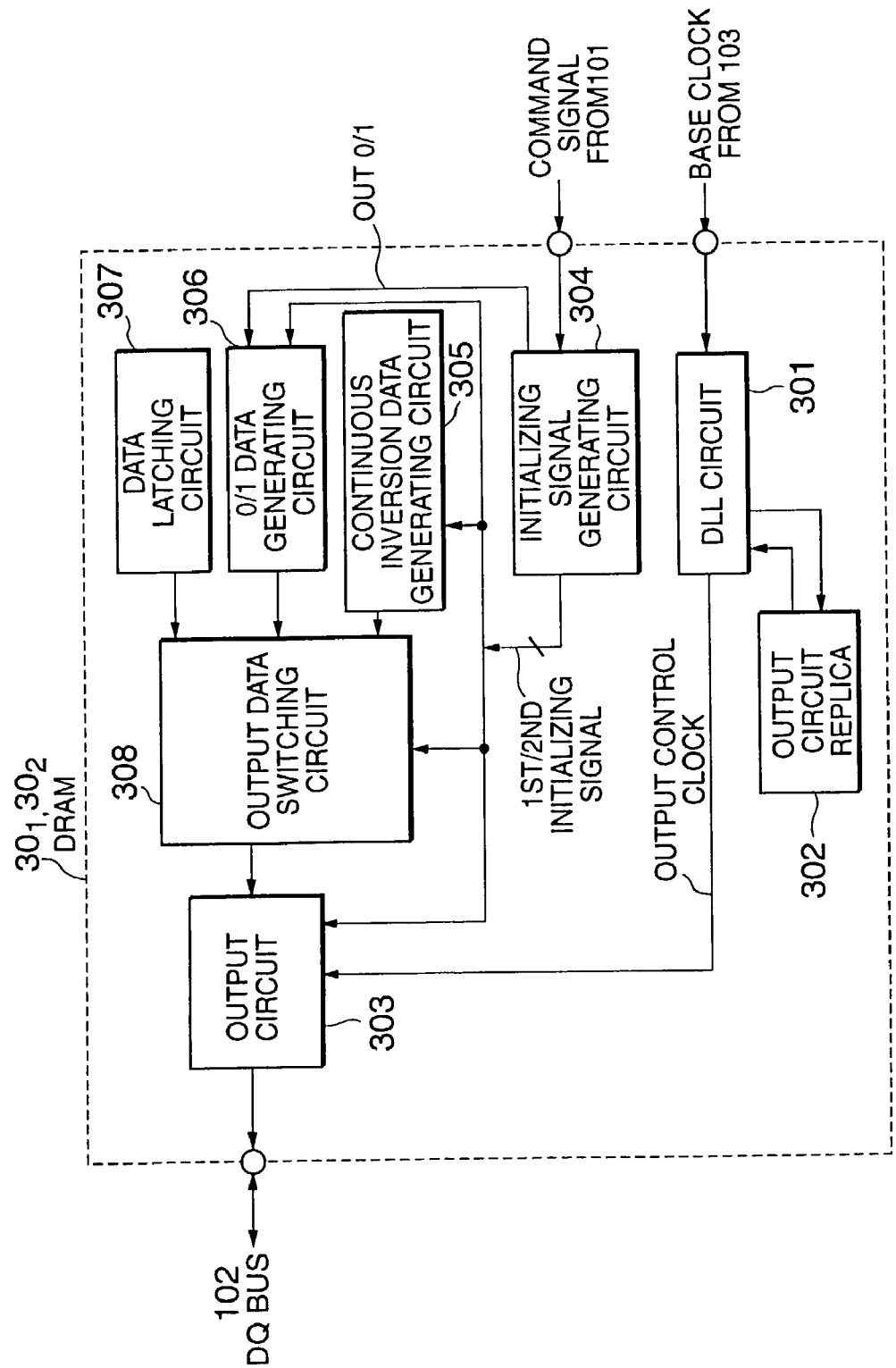
FIG. 5 is a diagram showing a configuration of a DRAM that permits the implementation of the calibration method according to the first embodiment of the present invention.
Figure 6:
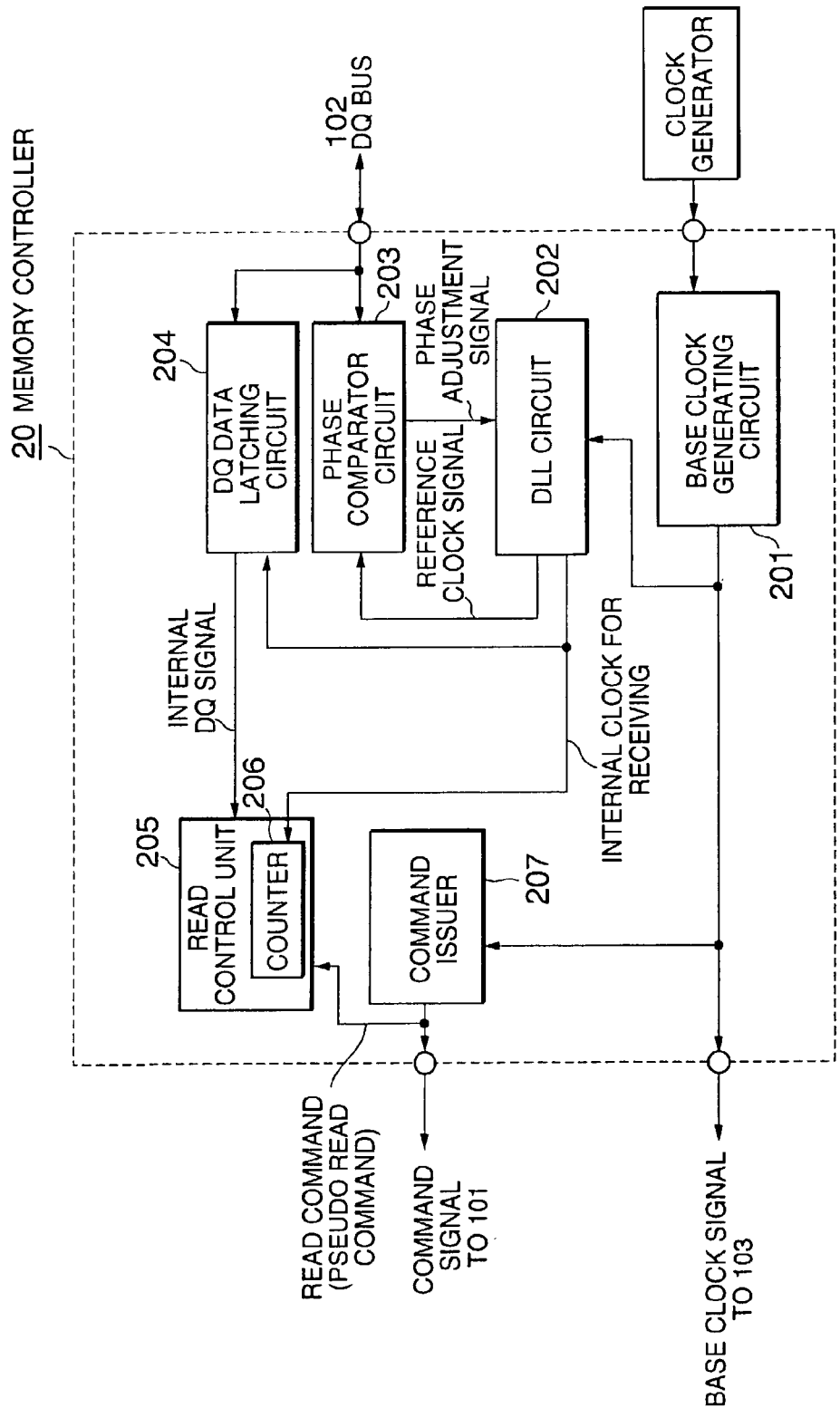
FIG. 6 is a diagram showing a configuration of a memory controller that permits the implementation of the calibration method according to the first embodiment of the present invention.

FIG. 5 and FIG. 6 are block diagrams showing schematic configurations of the DRAM (30₁ or 30₂) and the memory controller 20 that are capable of implementing the aforesaid first and second initializing procedures.

Referring to FIG. 5, the DRAM (30₁ or 30₂) is equipped with a DLL circuit 301, an output circuit replica 302, an output circuit 303, an initializing signal generating circuit 304, a continuous inversion data generating circuit 305, a 0/1 data generating circuit 306, a data latching circuit 307, and an output data switching circuit 308.

The output circuit replica 302 is a delay replica having a delay amount in the output circuit 303, and the DLL circuit 301 utilizes the output circuit replica 302 to generate an output control clock signal and supplies the generated output control clock signal to the output circuit 303. More detailedly, the output control clock signal generated by the DLL circuit 301 is obtained by sending forward the phase of the base clock signal by the delay amount in the output circuit 303 so as to adjust the DQ signal output from the output circuit 303 to the DQ bus 102 to the base clock signal.

Upon receipt of the first initializing instruction or the second initializing instruction from the memory controller 20 via the command/address bus 101, the initializing signal generating circuit 304 generates the first initializing signal or the second initializing signal and outputs the signal to the continuous inversion data generating circuit 305, the 0/1 data generating circuit 306, the output data switching circuit 308, and the output circuit 303 so as to cause the first or second initializing operation to be performed. Upon receipt of the OUT0 command or the OUT1 command via the command/address bus 101, the initializing signal generating circuit 304 transmits the OUT0 command or the OUT1 command to the 0/1 data generating circuit 306.

The continuous inversion data generating circuit 305 generates the continuous inversion signal in response to the first initializing signal, and outputs it to the output data switching circuit 308. The 0/1 data generating circuit starts the second initializing operation upon receipt of the second initializing signal, generates low level data upon receipt of the OUT0 command, or generates high level data upon receipt of the OUT1 command. The data latching circuit 307 is a circuit for latching data read from a memory cell array during a normal operation.

The output data switching circuit 308 selects an output of the continuous inversion data generating circuit 305 in the first initializing operation, selects an output of the 0/1 data generating circuit 306 in the second initializing operation, or selects an output of the data latching circuit 307 and outputs the selected output data to the output circuit 303 in the normal operation. The output circuit 303 operates on the basis of the output control clocks supplied from the DLL circuit 301, and transmits data received from the output data switching circuit 308 to the DQ bus 102 as a DQ signal.

The DRAM constructed as described above mostly operates as set forth below. In any operation, the output control clocks are generated by the DLL circuit 301 and the output circuit replica 302, and supplied to the output circuit 303. The output circuit 303 operates on the basis of the output control clocks.

Upon receipt of the first initializing instruction as a command signal from the memory controller 20 via the command/address bus 101, the initializing signal generating circuit 304 generates the first initializing signal and outputs the first initializing signal to the continuous inversion data generating circuit 305, the 0/1 data generating circuit 306, the output data switching circuit 308, and the output circuit 303. The first initializing signal is used to cause the aforesaid first initializing operation to be performed, meaning a disable signal to the 0/1 data generating circuit 306.

The continuous inversion data generating circuit 305 generates continuous inversion data, which provides the basis of the aforesaid continuous inversion signal, in response to the first initializing signal, and supplies the generated continuous inversion data to the output circuit 303 through the intermediary of the output data switching circuit 308 in the first initializing operation.

The output circuit 303 supplies the continuous inversion data to a particular DQ terminal as a continuous inversion signal in synchronization with an output control clock. Thus, as described above, the continuous inversion signal (the pseudo clock signal supplied via a DQ line) is transmitted to the memory controller 20 via the DQ bus (the particular DQ line) 102.

Meanwhile, upon receipt of the second initializing instruction as a command signal from the memory controller 20 via the command/address bus 101, the initializing signal generating circuit 304 generates the second initializing signal and outputs the second initializing signal to the continuous inversion data generating circuit 305, the 0/1 data generating circuit 306, the output data switching circuit 308, and the output circuit 303. The second initializing signal is used to cause the aforesaid second initializing operation to be performed, meaning a disable signal to the continuous inversion data generating circuit 305.

Then, upon receipt of the OUT0 command as a data output instruction, the initializing signal generating circuit 304 transmits the OUT0 command to the 0/1 data generating circuit 306. The 0/1 data generating circuit 306 generates low level data in response to the OUT0 command, and supplies the low level data to the output circuit 303 through the intermediary of the output data switching circuit 308.

The output circuit 303 transmits the low level data to the memory controller 20 via a DQ line in synchronization with an output control clock.

Furthermore, upon receipt of the OUT1 command as a data output instruction, the initializing signal generating circuit 304 transmits the OUT1 command to the 0/1 data generating circuit 306. The 0/1 data generating circuit 306 generates high level data in response to the OUT1 command, and supplies the high level data to the output circuit 303 through the intermediary of the output data switching circuit 308.

The output circuit 303 transmits the high level data to the memory controller 20 via a DQ line in synchronization with an output control clock.

Referring to FIG. 6, the memory controller 20 is equipped with a base clock generating circuit 201, a DLL circuit 202, a phase comparator circuit 203, a DQ data latching circuit 204, a read control unit 205, and a command issuer 207, the read control unit 205 being provided with a counter 206 for the second initializing operation. The base clock generating circuit 201 generates a base clock signal from a clock supplied from the clock generator 10. The base clock generating signal is propagated to the clock signal line 103 and also supplied to the DLL circuit 202 and the command issuer 207. The DLL circuit 202 controls the phase of the base clock signal supplied from the base clock generating circuit 201 on the basis of a phase adjustment signal from the phase comparator circuit 203, and generates a internal reception clock signal for comparison in the phase comparator circuit 203 and the internal reception clock signal in the memory controller 20. For the DLL circuit 202, one having a resolution of $1/500$ to $1/1000$ of a clock cycle is generally used. The phase comparator circuit 203 generates a phase adjustment signal for making phase adjustment such that the phase difference between the internal reception clock signal output from the DLL circuit 202 and the pseudo clock signal (continuous inversion signal) received via the DQ bus 102 is zero, and supplies the generated phase adjustment signal to the DLL circuit 202. The phase adjustment signal has, for example, a logical value 1 to adjust the phase to "+", while it has a logical value 0 to adjust the phase to "−". The DQ data latching circuit 204 latches the DQ data propagated through the DQ bus 102 on the basis of the internal reception clock signal generated by the DLL circuit 202, and outputs the latched data as an internal DQ signal. The counter 206 of the read control unit 205 counts the number of clocks of the internal clock signals for receiving until a high level data signal is received via the DQ bus 102 after the OUT1 command is issued from the command issuer 207 during the second initializing operation. To be more specific, the counter 206 of the read control unit 205 counts the rising edges of the internal clock signals for receiving until the internal DQ signal is switched to the high level after the command OUT1, which is a pseudo read command, is received from the command issuer 207. The read control unit 205 retains the number of clocks (the number of delay clocks) counted by the counter 206 as set forth above, and uses the number of delay clocks to control the timing for receiving read data (DQ data) thereafter. The command issuer 207 outputs commands, such as the first initializing instruction, the second initializing instruction, the OUT0 command, and the OUT1 command. Each of the commands is issued such that the rising edge of the base clock signal will be the center of the effective width of the command as described above.

The memory controller 20 constructed as set forth above mostly operates as described below.

The base clock generating circuit 201 uses a clock from the clock generator 10 to generate a base clock signal. The command issuer 207 issues a command signal such that the rising edge of the base clock signal will be the center of the effective width of the command signal. To be more specific, firstly, the command issuer 207 transmits the first initializing instruction as a command signal onto the command/address bus 101. The DLL circuit 202 controls the phase of the base clock signal from the base clock generating circuit 201, and generates an internal reception clock signal.

When the DRAM transmits a continuous inversion signal to the DQ bus 102 in response to the first initializing instruction, the phase comparator circuit 203 receives the continuous inversion signal as a pseudo clock signal, and compares the phase of the pseudo clock signal with the phase of the internal reception clock signal to generate a phase adjustment signal that brings the phase difference to zero, then outputs the generated phase adjustment signal to the DLL circuit 202. The DLL circuit 202 delays by 90 degrees the phase of the internal reception clock signal that brings the phase difference from the pseudo clock signal to zero, thereby producing the internal reception clock signal. At this time, the DLL circuit 202 retains, in a register provided in the DLL circuit 202, the phase difference between the generated internal reception clock signal and the base clock signal as the phase value for maintaining the generation of the internal reception clock signal. Controlling clock phases by using the phase value retained in the register enables the DLL circuit 202 to maintain the generation of the internal reception clock signal even after the first initializing operation.

When a predetermined time elapses after the command issuer 207 issues the second initializing instruction followed by the OUT0 command, low level data is transmitted onto the DQ bus 102 from the DRAM. Then, the command issuer 207 issues the OUT1 command, and when a predetermined time passes, high level data that has been transmitted from the DRAM appears on the DQ bus 102. Meanwhile, the DQ data latching circuit 204 latches the data propagated through the DQ bus on the basis of the internal reception clock signal that has been generated by the DLL circuit 202, and outputs the latched data to the read control unit 205 as an internal DQ signal. The counter 206 is triggered by the OUT1 command to start counting the rising edges of the internal clock signals for receiving, and terminates the counting at an edge where the internal DQ signal switches from the low level to the high level. Thus, the counter 206 is able to acquire the number of clocks (the number of delay clocks) of the internal clock signals for receiving until the internal DQ signal shifts to the high level after the OUT1 command is issued from the command issuer 207. The number of delay clocks is substantially identical to the number of clocks of the internal clock signals for receiving that is required from the moment the read command is issued from the command issuer 207 to the moment the data associated with the read command is received. Hence, by utilizing the number of delay clocks, data reading can be properly performed. The number of delay clocks is retained in the read control unit 205.

After the second initializing operation, the read control unit 205 utilizes the number of delay clocks acquired as described above so as to carry out data reading. To be more specific, the read control unit 205 receives the read data (DQ signal) associated with a read command, adjusting to the internal reception clock signal generated in the DLL circuit 202 when the number of delay clocks is reached since the command issuer 207 issued the read command.

EXAMPLE 2

The concept of the memory system according to the first embodiment described above can be applied also to a case where a DQ line (a bundle of DQ lines) for each byte or word is provided, and a clock signal line for transmitting a base clock signal is provided, corresponding to each DQ line (a bundle of DQ lines).

The memory system according to a second embodiment is an example in which the total bit width of the DQ bus in the memory system according to the first embodiment has been expanded, and related to a DRAM system having a general module construction.

Figure 7:
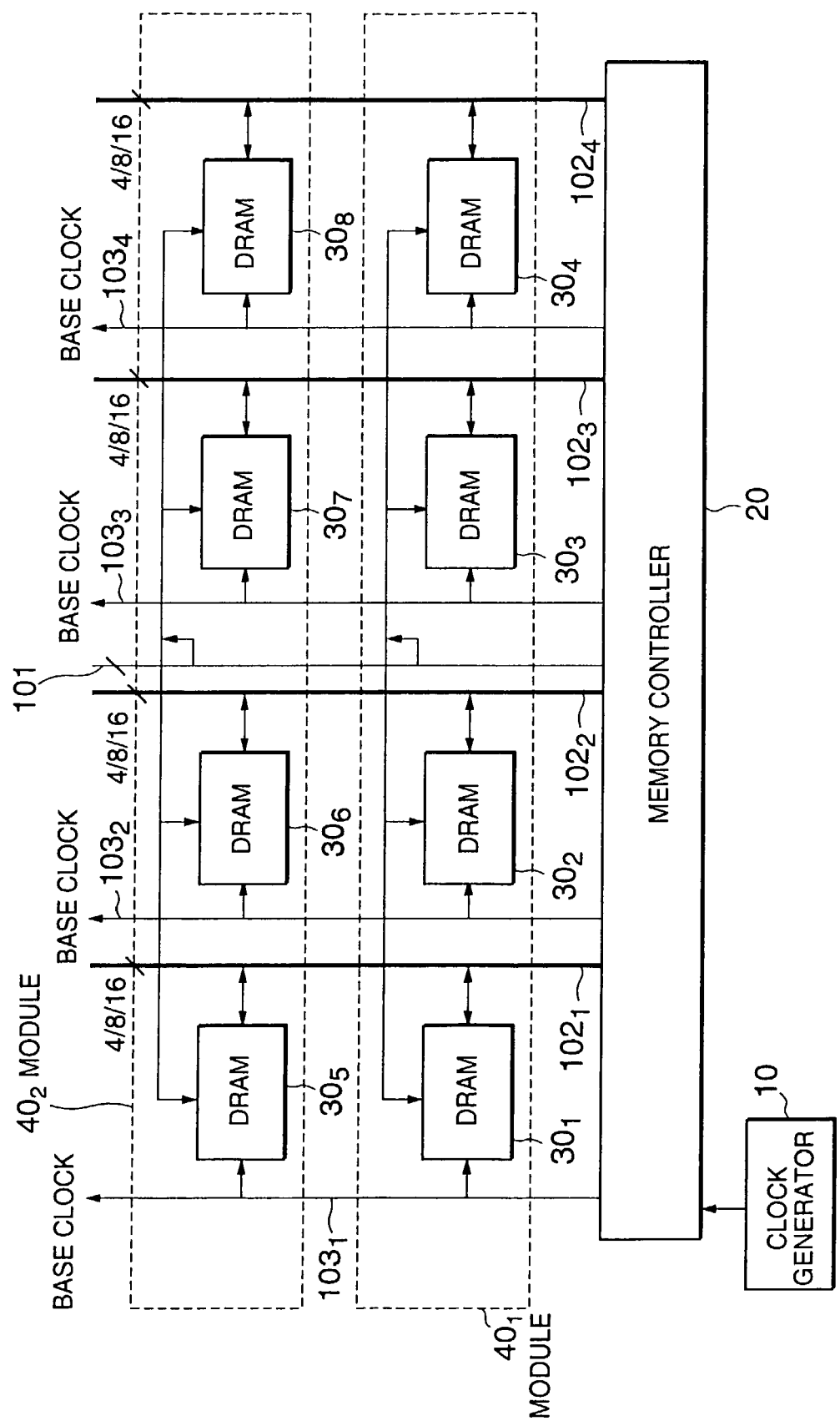
FIG. 7 is a diagram showing a schematic configuration of a memory system according to a second embodiment of the present invention.

Referring to FIG. 7, in this embodiment, DRAMs $30_1$ through $30_4$ are provided on a module $40_1$, and DRAMs $30_5$ through $30_8$ are provided on a module $40_2$. The bundles of DQ lines (also called as "DQ lanes") $102_1$ through $102_4$ constituting a DQ bus are provided for each pair of DRAMs $30_1$ and $30_5$, DRAMs $30_2$ and $30_6$, DRAMs $30_3$ and $30_7$, and DRAMs $30_4$ and $30_8$. Clock signal lines $103_1$, through $103_4$ for transmitting base clock signals are also provided in association with the bundles of DQ lines $102_1$ through $102_4$. A command/address bus 101 is shared by the DRAMs $30_1$ through $30_4$ and $30_5$ through $30_8$ arranged in parallel.

In the memory system constructed as described above, the memory controller 20 carries out the aforesaid first and second initializing procedures on all the DRAMs $30_1$ through $30_8$, and retains the resultant initializing data (the phase difference between the internal reception clock signal and the base clock signal, and the number of delay clocks). In this memory system, by using corresponding DQ lines and clock signal lines, the aforesaid first and second initializing procedures can be simultaneously carried out on the DRAMs $30_1$ through $30_4$ arranged in parallel. Similarly, the first and second initializing procedures can be simultaneously carried out on the DRAMs $30_5$ through $30_8$ arranged in parallel.

Figure 8:
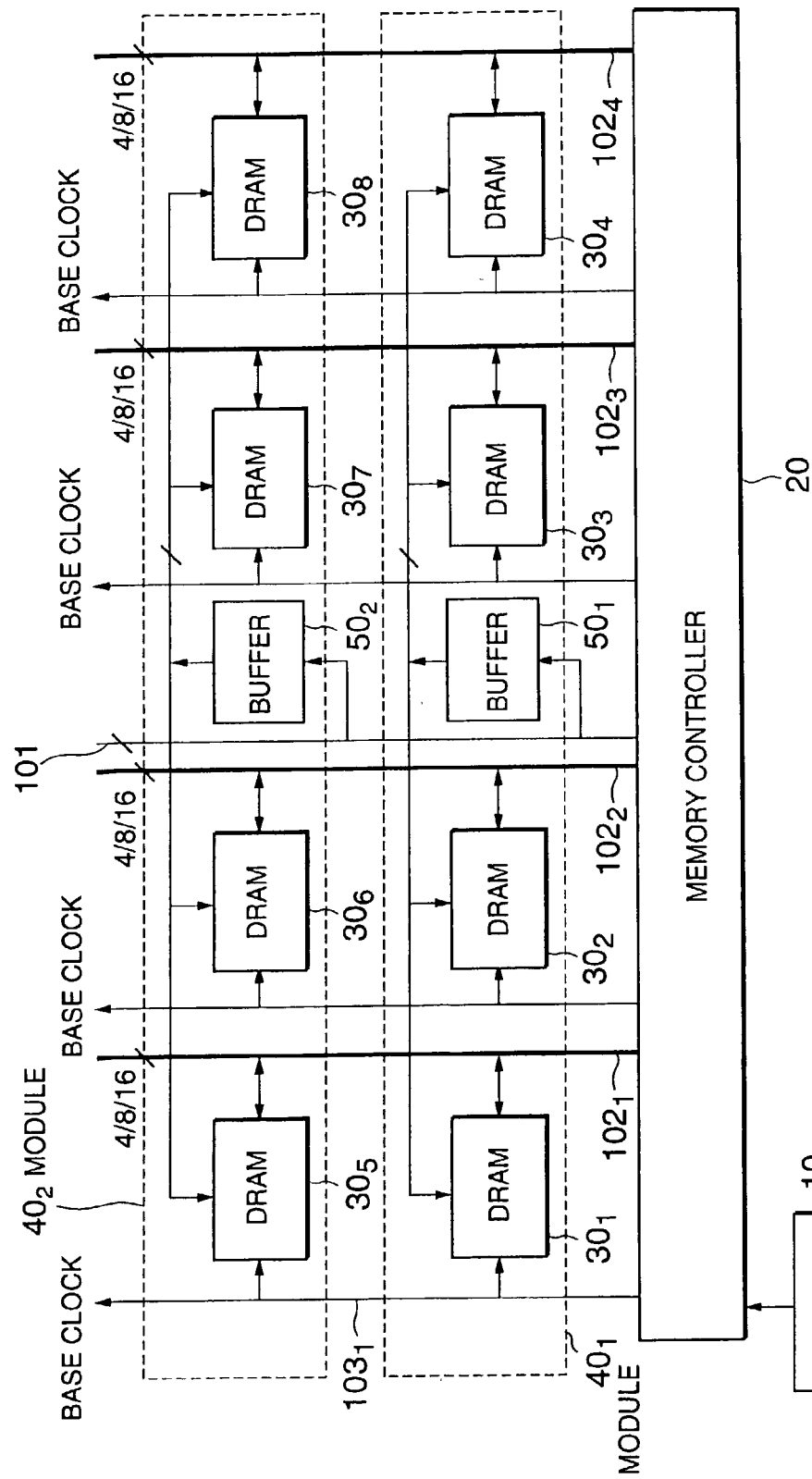
FIG. 8 is a diagram showing a modification example of the memory system according to the second embodiment of the present invention.

This embodiment can be applied also to a buffered type DRAM system, as shown in FIG. 8. In this case, command/address signals supplied via the command/address bus 101 are temporarily retained by buffers $50_1$ and $50_2$ provided on modules $40_1$ and $40_2$, then distributed thereafter to the DRAMs $30_1$ through $30_4$ and $30_5$ through $30_8$ on the corresponding modules $40_1$ and $40_2$.

Furthermore, in the foregoing DRAM system, a parity DQ bit line may be provided for each byte. For example, in the DRAM system shown in FIG. 7 or FIG. 8, if a DQ lane of 8 bits or 16 bits includes a parity, then there will be 9 bits or 18 bits, respectively.

It is needless to say that a clock signal line can be provided for each memory device also in the memory system having the general module construction as described above.

In the DRAM system set forth above, configurationally, data writing timed to the base clock signal is possible, and data reading will be properly performed by carrying out the first and second initializing procedures discussed above. If the propagation delay or the like with respect to each DRAM has been accurately acquired in advance by simulation or the like as described in the first embodiment, then the second initializing procedure may be omitted. In this embodiment also, the compensation for cross talk in the propagation of a pseudo clock signal, as explained in the first embodiment, can be performed.

EXAMPLE 3

A memory system according to a third embodiment of the present invention is intended for a reduction in the number of write clocks, as compared with the related technologies discussed above, and features an improved timing margin for a write mode by using a technique (to be discussed hereinafter) for realizing the aforesaid fewer write clocks.

Figure 9:
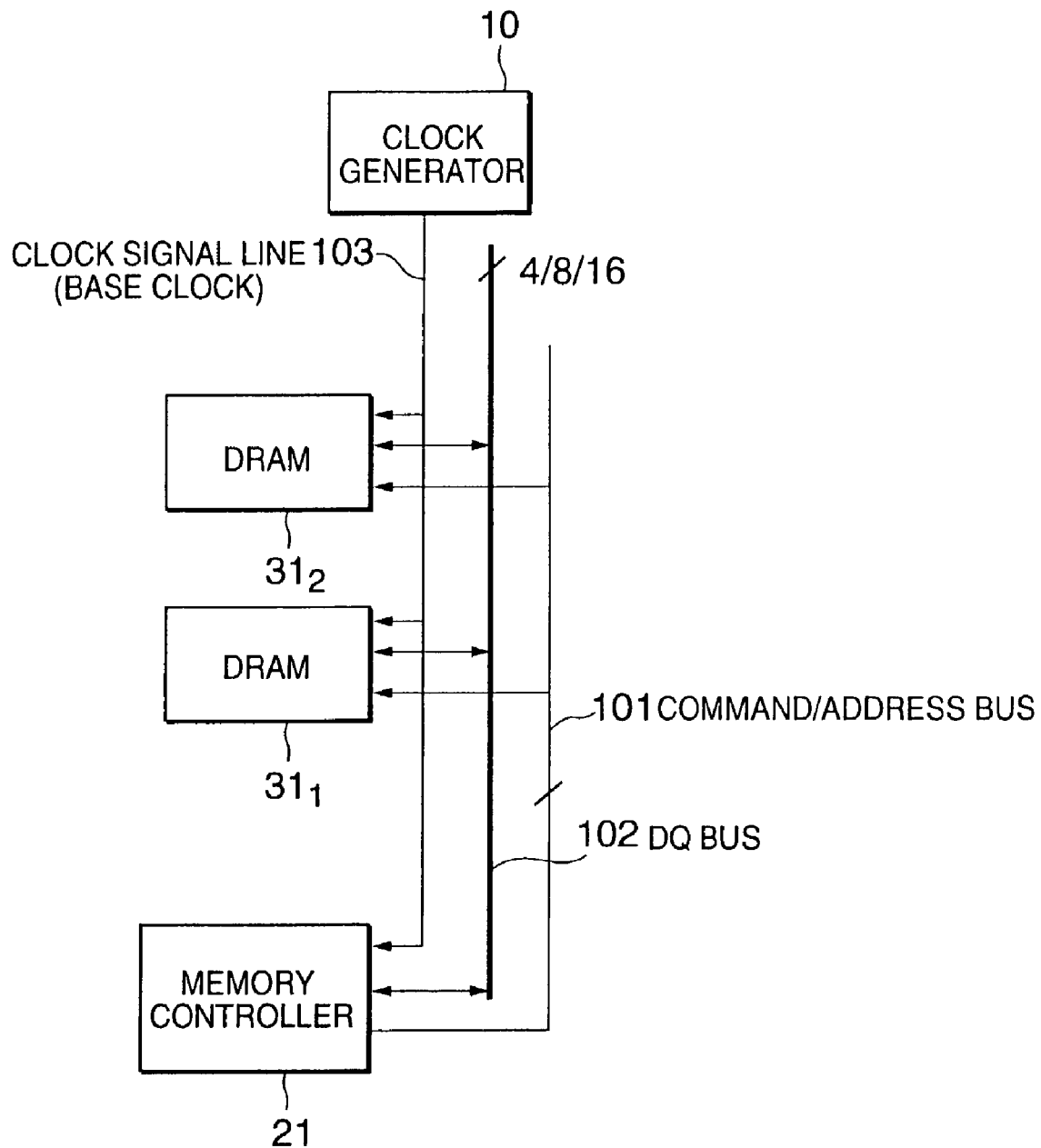
FIG. 9 is a diagram showing a schematic configuration of a memory system according to a third embodiment of the present invention.

The memory system according to this embodiment is equipped with a clock generator 10, a memory controller 21, and DRAMs $31_1$ and $31_2$, as shown in FIG. 9. Provided between the memory controller 21 and the DRAMs $31_1$ and $31_2$ are a command/address bus 101 for transmitting a command/address signal from the memory controller 21 to the DRAMs $31_1$ and $31_2$, a DQ bus 102 for transferring a DQ signal between the memory controller 21 and the DRAMs $31_1$ and $31_2$, and a clock signal line 103 for transmitting a base clock signal from the clock generator 10 to the memory controller 21 and the DRAMs $31_1$ and $31_2$. Of these, the command/address bus 101 is used also as a signal line for transmitting initializing signals from the memory controller 21 to the DRAMs $31_1$ and $31_2$.

As is obvious from FIG. 9, in this embodiment also, the memory controller 21 and the DRAMs $31_1$ and $31_2$ operate on the basis of a single base clock signal. The base clock signal is generated by the clock generator 10, and input to the DRAMs $31_1$ and $31_2$ and the memory controller 21. Read data is adjusted to the base clock signal and transmitted from the DRAMs $31_1$ and $31_2$ to the memory controller 21 via the DQ bus 102. The memory controller 21 receives the read data (DQ signal) on the basis of the base clock signal.

Write data to be written to the DRAMs $31_1$ and $31_2$ is timed to the base clock signal when it is output from the memory controller 21. However, the propagation delay arises on the DQ bus 102 or the like in the course from the memory controller 21 to the DRAMs $31_1$ and $31_2$, so that the DRAMs $31_1$ and $31_2$ will not be able to receive the write data (DQ signal) by using the base clock signal itself.

Hence, in this embodiment, internal clocks for receiving at the DRAMs $31_1$ and $31_2$ are generated in the DRAMs $31_1$ and $31_2$ according to a first initializing procedure set forth below, and write data from the memory controller 21 is received by using the internal reception clock signal. In the first initializing procedure, the adjustment of the propagation delay is to be performed on the basis of the DQ signal itself. Accordingly, this embodiment is free from a reduction in the receiving timing margin caused by a propagation time difference between a write clock and the DQ signal, which poses a problem in the foregoing related technologies.

In this embodiment, a command/address signal also involves propagation delay, making it impossible for the DRAMs $31_1$ and $31_2$ to receive the command/address signal by using the base clock signal itself. For this reason, in this embodiment, the command/address signal is received by using the internal reception clock signal generated according to the first initializing procedure.

The initializing signal that trigger the first initializing procedure, which will be described in detail below, is transmitted from the memory controller 21 to the DRAMs $31_1$ and $31_2$ via the command/address bus 101. However, before the first initializing procedure is finished, the DRAMs $31_1$ and $31_2$ have not yet generated the internal reception clock signal. This means that the transfer of an initializing signal cannot be performed at a timing and rate in a normal operation based on the base clock signal. Hence, in this embodiment, the transfer of only the initializing signal is performed at a lower rate than the base clock signal. More specifically, in this embodiment, the initializing signal is transferred at a rate lower than the rate of the base clock, and the first initializing procedure thereafter is carried out at the same rate as that of the base clock accordingly. For instance, the memory controller 21 and the DRAMs $31_1$ and $31_2$ are provided with frequency dividers for dividing the frequency of a base clock signal from the clock generator 10. When the system is started up, the frequency dividers are turned ON to generate clocks slower than the base clock. The memory controller 21 transmits the initializing signal and turns OFF the frequency dividers, then begins the first initializing operation performed at the rate of the base clock signal. Meanwhile, upon receipt of the initializing signal on the basis of the slower clock, the DRAMs $31_1$ and $31_2$ turn OFF the frequency dividers and starts the first initializing operation carried out at the rate of the base clock signal. If, for example, a DRAM is set in an initializing mode whenever its power is turned ON, or adapted to automatically begins the first initializing operation under a predetermined condition, or if an instruction for moving to the first initializing operation can be transmitted from a memory controller to a DRAM device according to a method other than the transfer of the initializing signal at the aforesaid lower rate, then these may be implemented to carry out the first initializing operation explained below.

Figure 10:
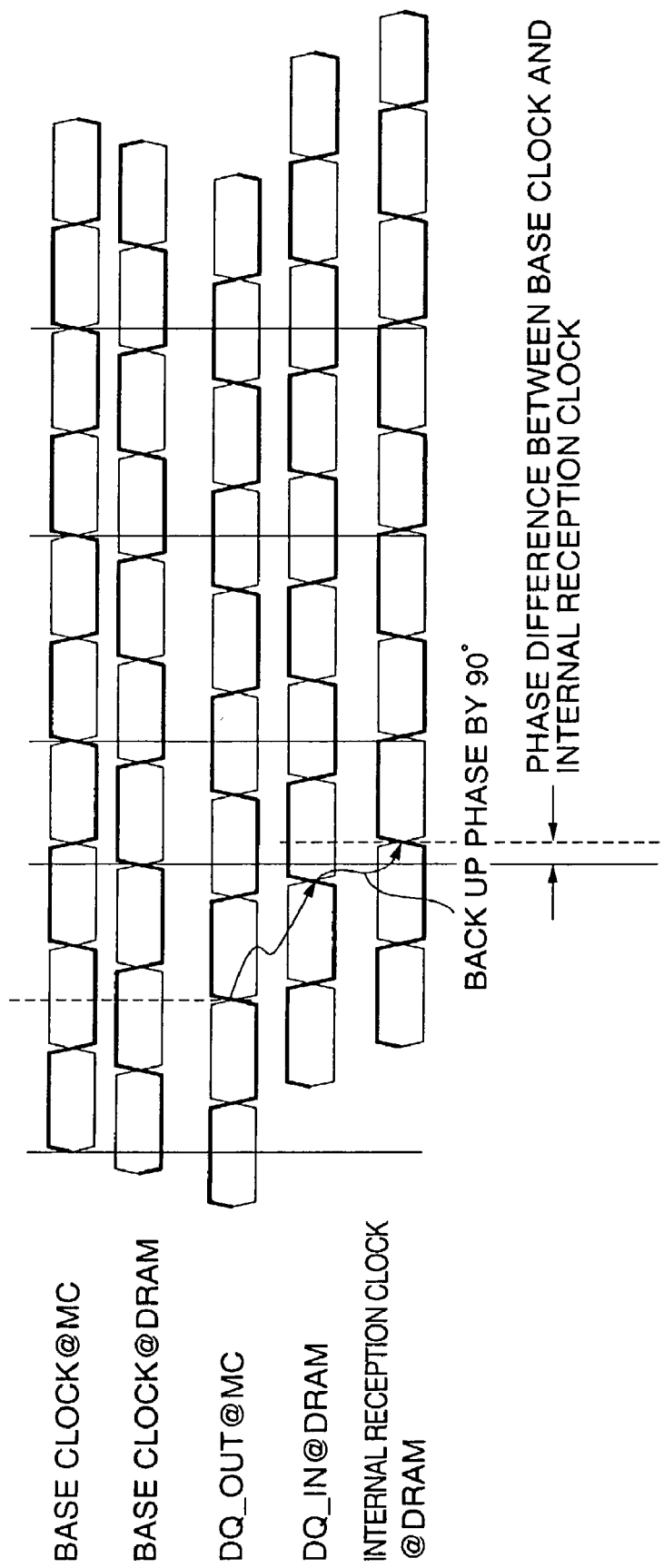
FIG. 10 is a timing chart showing a first initializing procedure in a calibration method according to the third embodiment of the present invention.

Referring also to FIG. 10, the procedure for generating the internal reception clock signal at the DRAMs $31_1$ and $31_2$ will be explained. The internal reception clock signal is generated in each of DRAMs $31_1$ and $31_2$. In the following, the descriptions will be given of the case of the DRAM $31_2$; however, the same applies to the case of the DRAM $31_1$.

First, the memory controller 21 issues an initializing signal (initializing instruction) at a lower rate than that of the base clock signal to the DRAM $31_2$ via the command/address bus 101, and also starts the first initializing operation. Upon receipt of the initializing signal, the DRAM $31_2$ begins the first initializing operation and sets itself in a standby mode for receiving a continuous inversion signal (pseudo clock signal). The moment the first initializing operation is begun, the memory controller 21 outputs a continuous inversion signal matched to the center of the base clock signal to a particular DQ terminal (refer to the base clock@MC and DQ_out@MC in FIG. 10). As is obvious from FIG. 10, in this embodiment, the output timing of the continuous inversion signal is the same timing as the timing at which the memory controller 21 outputs the DQ signal in the normal operation. More specifically, the memory controller 21 outputs the continuous inversion signals at the rise and/or fall of the base clock signal. The DRAM $31_2$ receives the continuous inversion signal as a pseudo clock signal (refer to DQ_in @DRAM in FIG. 10), and backs up the phase of the received pseudo clock signal (continuous inversion signal) by 90 degrees so as to generate the internal reception clock signal at the DRAM $31_2$ (refer to the receiving internal clock@DRAM in FIG. 10). Thus, the DRAM $31_2$ generates an internal reception clock signal that has a phase optimum for receiving write data (DQ signal) during the normal operation. The DRAM $31_2$ retains the phase difference between the internal reception clock signal and the base clock signal, so that it can maintain the generation of the internal reception clock signal after the first initializing procedure is terminated (after the internal reception clock signal is generated). Therefore, when the first initializing procedure is ended, the DRAM is able to properly receive write data by using the internal reception clock signal.

In this embodiment, the continuous inversion signals as the pseudo clock signals are transmitted from the memory controller 21 to the DRAM $31_2$ by using two DQ lines among a plurality of DQ lines constituting the DQ bus 102. The continuous inversion signals transmitted over the two DQ lines are complementary to each other. Adopting such two continuous inversion signals as pseudo clock signals allows clocks to be detected on the basis of the cross point thereof, thus making it possible to improve the accuracy of timing for generating the internal reception clock signal at the DRAM $31_2$. It is possible to generate the internal reception clock signal by using a single DQ line and a single continuous inversion signal. In such a case, in order to identify H/L of the continuous inversion signal as the pseudo clock signal, it is necessary to compare the continuous inversion signal and a reference potential ($V_{REF}$). In this case, if noise fluctuation or the like takes place in the reference potential VREF, then a shift takes place in clock detection, resulting in deteriorated timing accuracy, as compared with the case where the two DQ lines are used as set forth above. Accordingly, for the transmission of continuous inversion signals, it is preferred to use two DQ lines to transmit continuous inversion signals that are complementary to each other. In this embodiment also, the technology for compensating for cross talk in the transmission of the continuous inversion signal set forth in the first embodiment can be adopted. More specifically, in this embodiment also, as explained in the first embodiment, the compensation for cross talk during the transmission of continuous inversion signals can be accomplished by driving the DQ lines other than the two particular lines such that the signals transmitted to adjoining DQ lines are inverted against each other.

Figure 11:
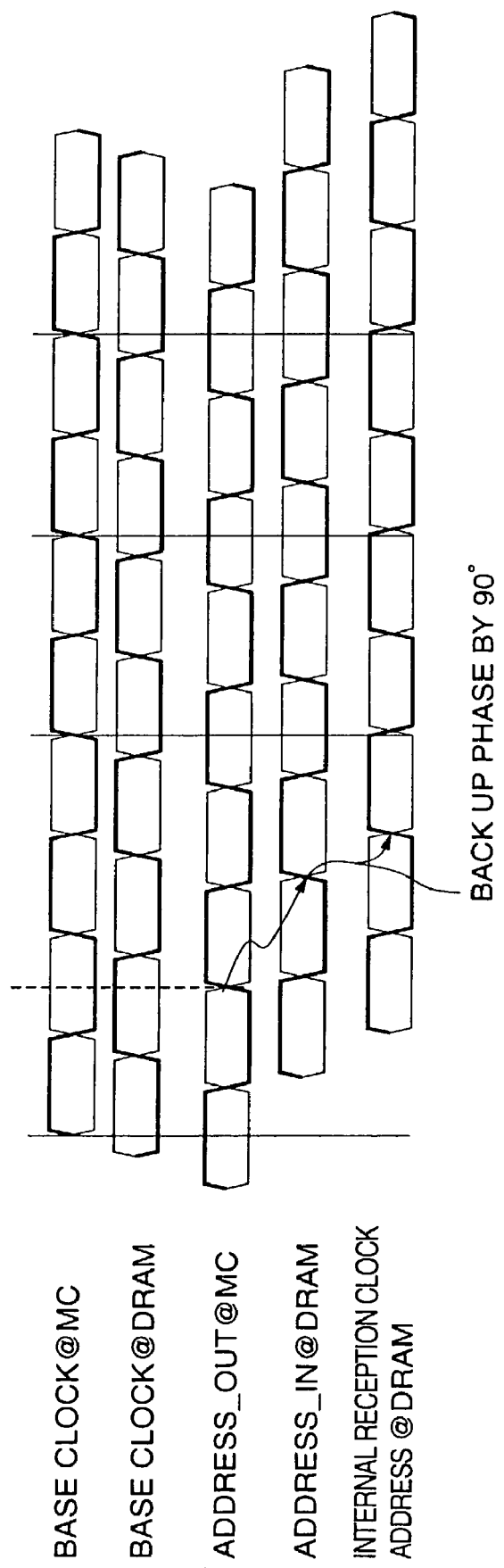
FIG. 11 is a timing chart illustrating an initializing procedure for generating an internal reception clock signal for a command/address signal in the calibration method according to the third embodiment of the present invention.

If the command/address bus 101 shares the same bus topology with the DQ bus 102, then a command/address signals can be properly received by using a DRAM internal clock for receiving generated on the basis of the DQ signal. If, however, the bus topology differs between the command/address bus 101 and the DQ bus 102, then the signal propagation delay will be different. Hence, it is necessary to carry out the initializing procedure for receiving command/address signals, as shown in FIG. 11. However, as the comparison between FIG. 11 and FIG. 10 indicates, the processing procedures are substantially the same as the procedure for generating the internal clock signals for receiving DQ signals described above, except for the following aspect.

Specifically, to generate the internal clock signals for receiving the command/address signals, the memory controller 21 transmits the continuous inversion signal to a particular address line or command line in place of a particular DQ line (refer to Address_out@MC in FIG. 11). Hence, the DRAM $31_2$ also receives the continuous inversion signal through a particular address line or command line (refer to Address_in@DRAM in FIG. 11). The DRAM $31_2$ generates an internal reception clock signal an address/command signal on the basis of the received continuous inversion signal (refer to Address receiving internal clock @DRAM in FIG. 11).

Further improved timing accuracy can be achieved by transmitting complementary continuous inversion signals to two particular address lines and/or command lines (two address lines and two command lines or one address line and one command line) among the address lines and command lines also when generating the internal reception clock signal for receiving an address/command signal. The technology for compensating for cross talk during the transmission of continuous inversion signals to the aforesaid DQ signal lines can be applied also for generating the internal reception clock signal for receiving an address/command signal. More specifically, to generate the internal reception clock signal for receiving an address/command signal, address lines and command lines other than the two particular address lines and/or command lines are driven such that the signals transmitted to adjoining address lines, adjoining command lines, and adjoining address line and command line are inverted against each other. This permits the compensation for cross talk to be effected during the transmission of continuous inversion signals for generating the internal clocks for receiving the address/command signals.

In this embodiment, the internal reception clock signal for receiving a DQ signal (and a command/address signal, if necessary) is generated at the DRAM $31_2$, as described above, thereby allowing the DRAM $31_2$ to properly receive the DQ signal (and the command/address signal, if necessary). Read data is output from the DRAM $31_2$ to the memory controller 21 at the timing of the base clock signal at the DRAM $31_2$. However, the memory controller 21 does not know the signal propagation delay on the DQ bus 102; hence, the receipt of the read data cannot be properly effected. For this reason, in this embodiment, a second initializing procedure described below is carried out after the first initializing procedure is finished, thereby allowing the memory controller 21 to acquire the delay time from the issuance of the read command to the receipt of the read data.

In the second initializing procedure, the memory controller 21 uses the reference DQ data output instruction (OUT0 command or OUT1 command). The reference dQ data output instruction (OUT0 command or OUT1 command) has the same function as that of the reference DQ data output instruction (OUT0 command or OUT1 command) in the first embodiment described above. The DRAM $31_2$ outputs the reference DQ data specified by the same clock latency as that in a normal read operation according to the reference DQ data output instruction. In other words, in this embodiment, the number of clocks required for the reference DQ data to be output after the reference DQ data output instruction is input to the DRAM $30_2$ is the same as that in the normal operation.

Figure 12:
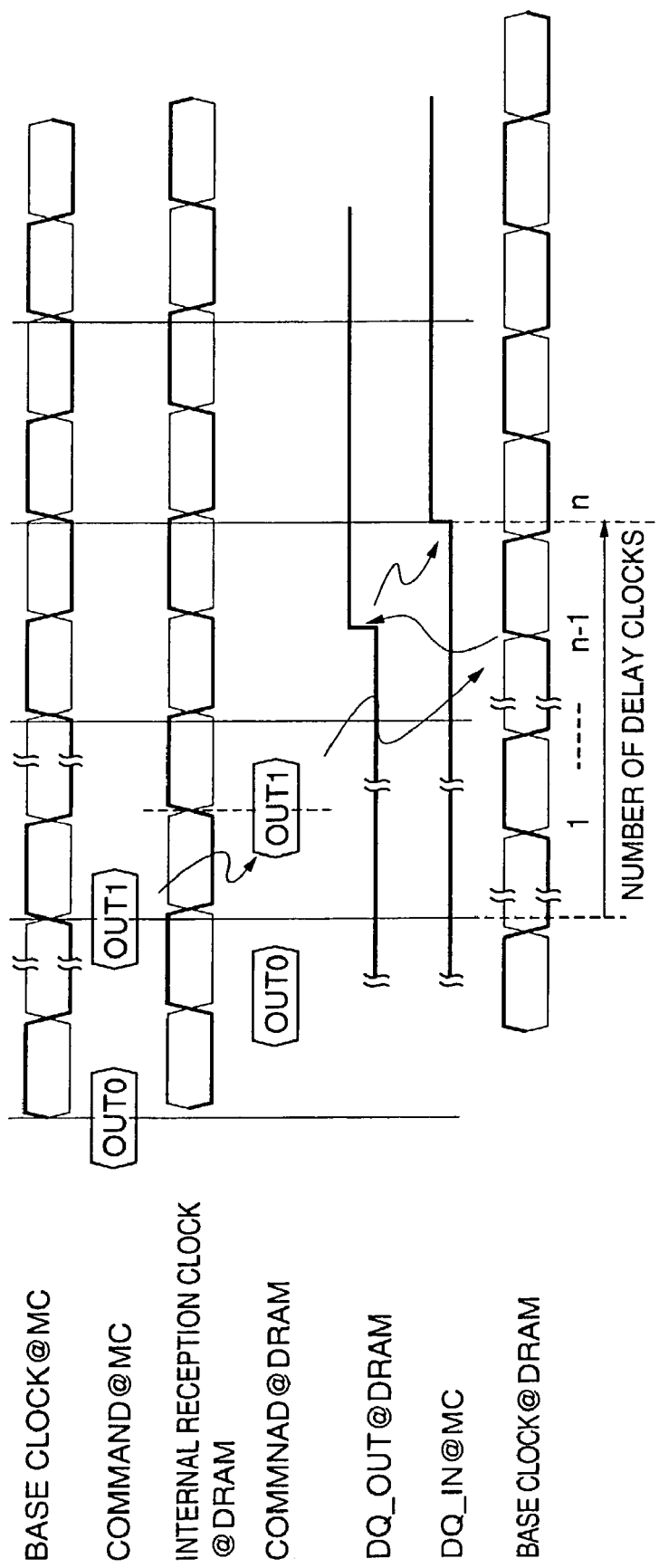
FIG. 12 is a timing chart showing a second initializing procedure in a calibration method according to the third embodiment of the present invention.

To be more specific, the memory controller 21 first issues a second initializing instruction to the DRAM $31_2$ by using the command/address bus 101, then it issues the OUT0 command (refer to command@MC in FIG. 12). The second initializing instruction and the OUT0 command are issued such that the rising edge of the base clock signal will be the center of the effective width of the command. Upon receipt of the second initializing instruction, the DRAM $31_2$ moves into a mode for carrying out the second initializing procedure, and outputs low level data onto a DQ line at the timing of the base clock signal in the DRAM $31_2$ (refer to base clock@DRAM and DQ_out@DRAM) upon receipt of the OUT0 command (refer to receiving internal clock@DRAM and command@DRAM in FIG. 12) according to the internal reception clock signal generated in the first initializing procedure. Meanwhile, after outputting the OUT0 command, the memory controller 20 outputs the OUT1 command via the command/address bus 101 (refer to command@MC in FIG. 12). The OUT1 command is also issued such that the rising edge of the base clock signal will be the center of the effective width of the command. Upon receipt of the OUT1 command by using the internal reception clock signal (refer to internal reception clock signal for receiving@DRAM and command@DRAM in FIG. 12), the DRAM $30_2$ outputs high level data onto a DQ line (refer to base clock@DRAM and DQ_out@DRAM in FIG. 12) to match the base clock signal in the DRAM $31_2$. The memory controller 20 monitors the level of the data transmitted to the DQ lines to detect the point at which the level is switched from low to high, thereby finding the moment the reference DQ data associated with the OUT1 command arrives (refer to DQ_in@MC in FIG. 12). Thus, the memory controller 20 counts the number of clocks of the base clock signals at the memory controller 21 from the issuance of the OUT1 command to the receipt of high level data via a DQ line, and retains the count result as the number of delay clocks (refer to the base clock@MC in FIG. 12).

By the time the second initializing procedure explained above is completed, the memory controller 21 will hold the number of delay clocks for the DRAM $31_2$. Therefore, to read data from the DRAM $31_2$, the read data associated with the read command can be properly received at the timing of the base clock signal at the memory controller 21 at the moment the number of delay clocks is reached after the read command was issued.

In this embodiment, the first and second initializing procedures explained in conjunction with the DRAM $31_2$ must be carried out on all DRAMs ($30_1$) connected to the DQ bus 102. Each DRAM generates the internal reception clock signal for receiving the DQ signal in each DRAM itself (and the internal reception clock signal for receiving the command/address signal, if necessary), and the memory controller 21 retains the number of delay clocks for each DRAM. This enables all DRAMs to properly receive write data from the memory controller 21 and also properly receive read data from all DRAMs in the memory controller 21.

In this embodiment also, as explained in the first embodiment, the second initializing procedure of the initializing procedures discussed above is dispensable in a case where the time required from the moment the read command is issued from the memory controller to the moment the read data associated with the command is received by the memory controller can be accurately known in advance by, for example, simulation or the like.

Figure 13:
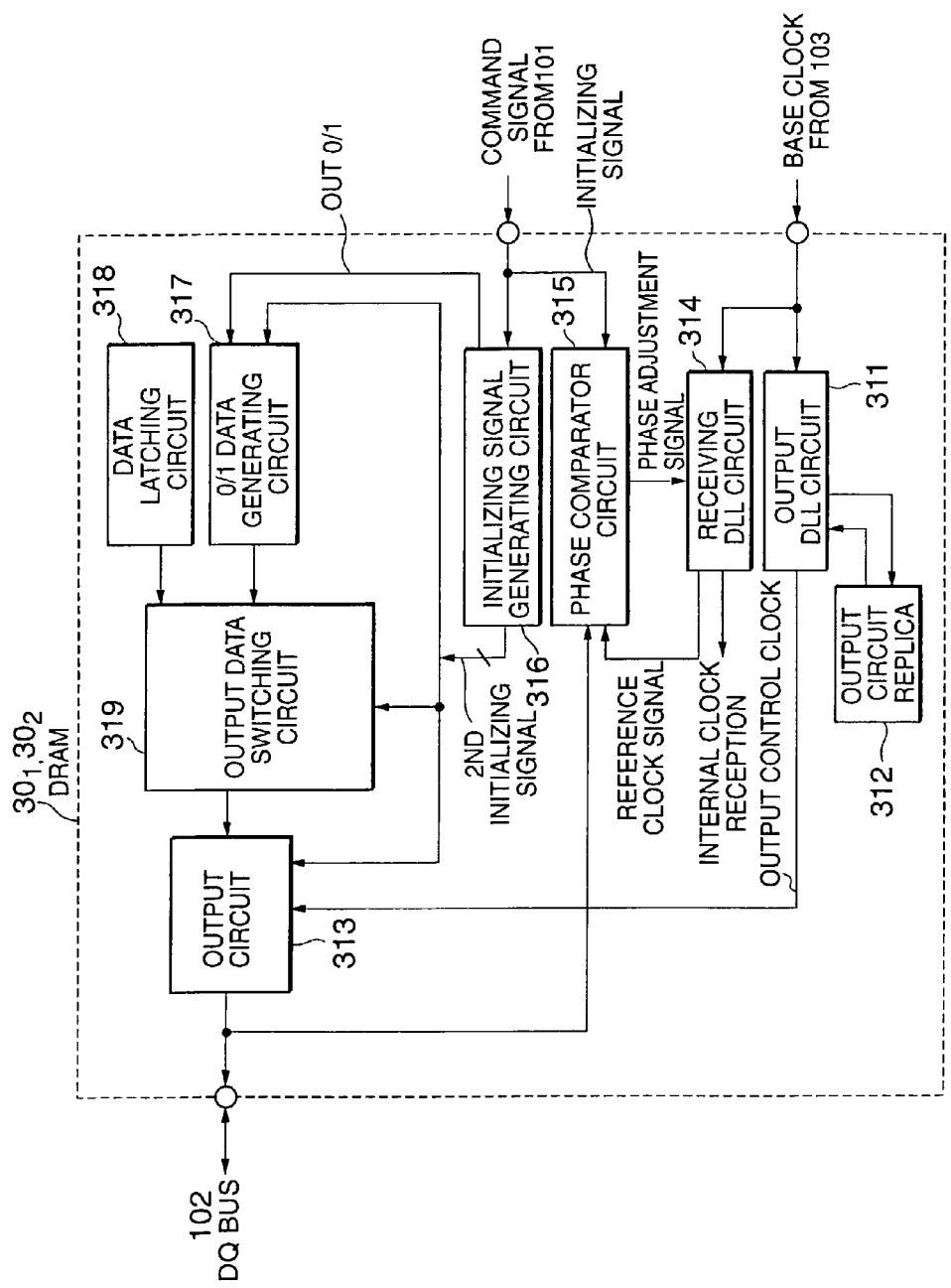
FIG. 13 is a diagram showing a configuration of a DRAM that permits the implementation of the calibration method according to the third embodiment of the present invention.
Figure 14:
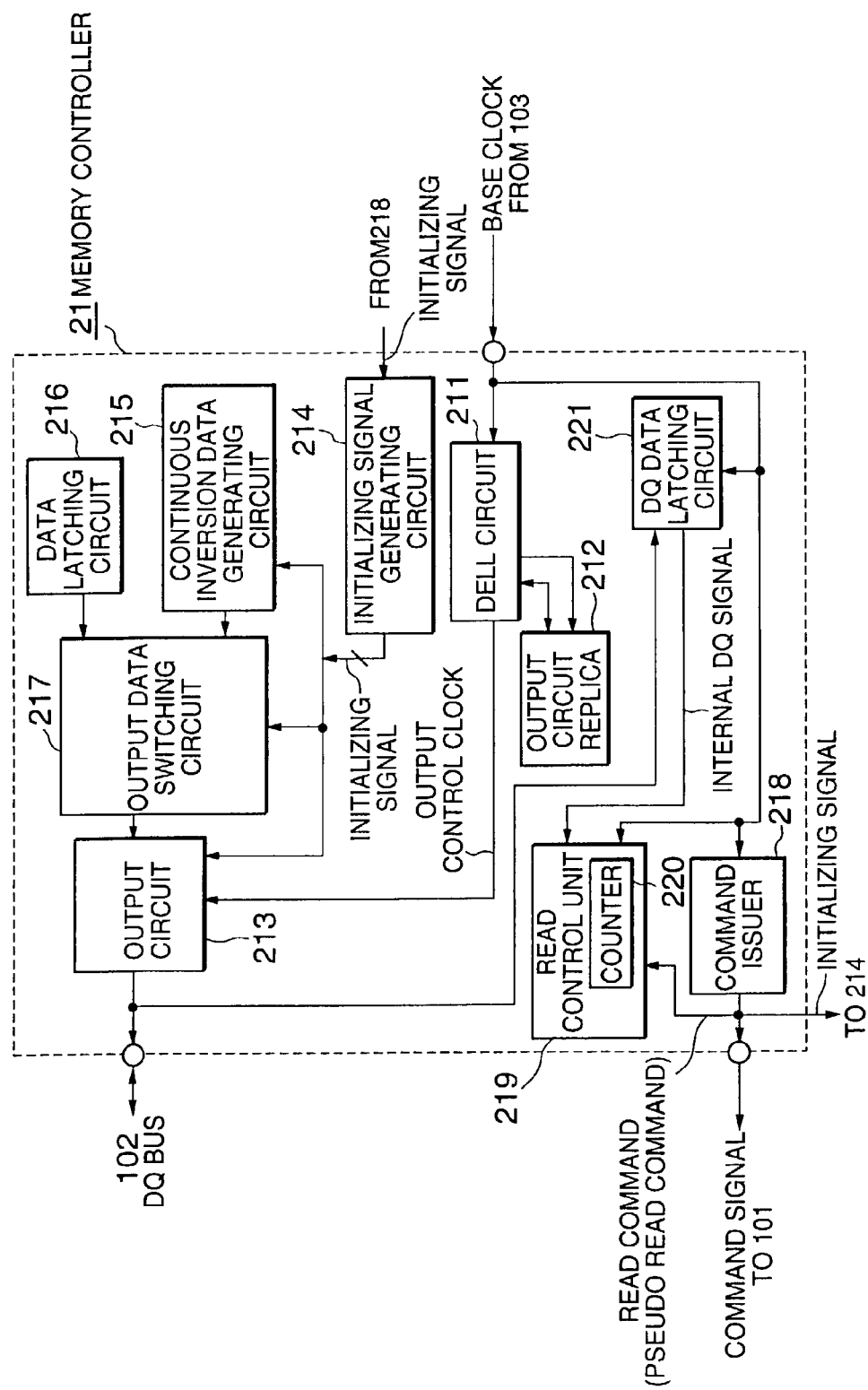
FIG. 14 is a diagram showing a configuration of a memory controller that permits the implementation of the calibration method according to the third embodiment of the present invention.

FIG. 13 and FIG. 14 are block diagrams showing schematic configurations of DRAMs ($30_1$ or $31_2$) and memory controller 21 capable of implementing the foregoing first and second initializing procedures.

Referring to FIG. 13, the DRAMs ($30_1$ or $31_2$) is provided with an output DLL circuit 311, an output circuit replica 312, an output circuit 313, a receiving DLL circuit 314, a phase comparator circuit 315, an initializing signal generating circuit 316, a 0/1 data generating circuit 317, a data latching circuit 318, and an output data switching circuit 319.

The output circuit replica 312 is a delay replica having a delay amount in the output circuit 313, and the output DLL circuit 311 utilizes the output circuit replica 312 to generate an output control clock signal and supplies the generated output control clock signal to the output circuit 313. More detailedly, the output control clock signal generated by the output DLL circuit 311 is obtained by sending forward the phase of the base clock signal by the delay amount in the output circuit 313 so as to adjust the DQ signal output from the output circuit 313 to the DQ bus 102 to the base clock signal.

Meanwhile, the receiving DLL circuit 312 controls the phase of the base clock signal on the basis of a phase adjustment signal from the phase comparator circuit 315 to generate an internal reception clock signal for comparison in the phase comparator circuit 315 and an internal reception clock signal for receiving write data (DQ signals) at the DRAM. The phase comparator circuit 315 generates a phase adjustment signal for adjusting the phases such that the phase difference between the internal reception clock signal output from the receiving DLL circuit 314 and the pseudo clock signal (continuous inversion signal) received via the DQ bus 102 becomes zero, and supplies the generated phase adjustment signal to the receiving DLL circuit 314. The phase adjustment signal generated by the phase comparator circuit 315 is, for example, the same as that generated by the phase comparator circuit 203 (refer to FIG. 6) in the first embodiment. In this embodiment, the phase comparator circuit 315 turns ON in response to an initializing signal.

Upon receipt of the second initializing instruction from the memory controller 21 via the command/address bus 101, the initializing signal generating circuit 316 generates the second initializing signal and outputs the generated signal to the 0/1 data generating circuit 317, the output data switching circuit 319, and the output circuit 313 so as to cause the second initializing operation to be performed. Upon receipt of the OUT0 command or the OUT1 command via the command/address bus 101, the initializing signal generating circuit 316 transmits the OUT0 command or the OUT1 command to the 0/1 data generating circuit 317.

The 0/1 data generating circuit 317 starts the second initializing operation upon receipt of the second initializing signal, generates low level data upon receipt of the OUT0 command, or generates high level data upon receipt of the OUT1 command. The data latching circuit 318 is a circuit for latching data read from a memory cell array during a normal operation.

The output data switching circuit 319 selects an output of the 0/1 data generating circuit 317 in the second initializing operation, or selects an output of the data latching circuit 318 and outputs the selected output data to the output circuit 313 in the normal operation. The output circuit 313 operates on the basis of the output control clocks supplied from the output DLL circuit 313, and transmits data received from the output data switching circuit 319 to the DQ bus 102 as a DQ signal.

The DRAM constructed as described above mostly operates as set forth below.

First, upon receipt of the initializing signal at a rate lower than that of the base clock signal from the memory controller 21 via the command/address bus 101, the phase comparator circuit 315 turns ON to be set in a standby mode for receiving a pseudo clock signal (the first initializing operation). At this time, the receiving DLL circuit 314 controls the phase of the base clock signal and generates an internal reception clock signal, whereas it is not working to fulfill its intended purpose because the phase adjustment signal has not yet been issued.

Then, when the memory controller 21 transmits a pseudo clock signal (continuous inversion signal) to the DQ bus 102, the phase comparator circuit 315 receives the continuous inversion signal as a pseudo clock signal, and compares the phase of the pseudo clock signal with the phase of the internal reception clock signal to generate a phase adjustment signal that brings the phase difference to zero, then outputs the generated phase adjustment signal to the receiving DLL circuit 314. The receiving DLL circuit 314 delays by 90 degrees the phase of the internal reception clock signal that brings the phase difference from the pseudo clock signal to zero, thereby producing the internal reception clock signal. At this time, the receiving DLL circuit 314 retains, in a register provided in the receiving DLL circuit 314, the phase difference between the generated internal reception clock signal and the base clock signal as the phase value for maintaining the generation of the internal reception clock signal. Controlling clock phases by using the phase value retained in the register enables the receiving DLL circuit 314 to maintain the generation of the internal reception clock signal even after the first initializing operation.

Thereafter, upon receipt of the second initializing instruction as a command signal from the memory controller 21 via the command/address bus 101, the initializing signal generating circuit 316 generates the second initializing signal, and outputs the second initializing signal to the 0/1 data generating circuit 317, the output data switching circuit 319, and the output circuit 313.

Subsequently, upon receipt of the OUT0 command as a data output instruction, the initializing signal generating circuit 316 transmits it to the 0/1 data generating circuit 317. The 0/1 data generating circuit 316 generates low level data in response to the OUT0 command, and supplies the low level data to the output circuit 313 through the intermediary of the output data switching circuit 319.

The output circuit 313 transmits the low level data to the memory controller 21 via a DQ line in synchronization with an output control clock.

Upon receipt of the OUT1 command as a data output instruction, the initializing signal generating circuit 316 transmits it to the 0/1 data generating circuit 317. The 0/1 data generating circuit 317 generates high level data in response to the OUT1 command, and supplies the high level data to the output circuit 313 through the intermediary of the output data switching circuit 319.

The output circuit 313 transmits the high level data to the memory controller 21 via a DQ line in synchronization with an output control clock.

Referring to FIG. 14, the memory controller 21 is provided with a DLL circuit 211, an output circuit replica 212, an output circuit 213, an initializing signal generating circuit 214, a continuous inversion data generating circuit 215, a data latching circuit 216, an output data switching circuit 217, a command issuer 218, a read control unit 219, and a DQ data latching circuit 221. The read control unit 219 is provided with a counter 220 for the second initializing operation.

The output circuit replica 212 is a delay replica having a delay amount in the output circuit 213, and the DLL circuit 211 utilizes the output circuit replica 212 to generate an output control clock signal and supplies the generated output control clock signal to the output circuit 213. More detailedly, the output control clock signal generated by the DLL circuit 211 is obtained by sending forward the phase of the base clock signal by the delay amount in the output circuit 213 so as to adjust the DQ signal output from the output circuit 213 to the DQ bus 102 to the base clock signal.

In response to the initializing signal issued by the command issuer 218, the initializing signal generating circuit 214 generates an internal initializing signal for shifting the memory controller 21 itself into an initialized state, and outputs the generated initializing signal to the continuous inversion data generating circuit 215, the output data switching circuit 217, and the output circuit 213 so as to perform the second initializing operation.

In response to the initializing signal from the initializing signal generating circuit 214, the continuous inversion data generating circuit 215 generates a continuous inversion signal and outputs it to the output data switching circuit 217. The data latching circuit 216 latches write data in the normal operation and outputs it to the output data switching circuit 217.

The output data switching circuit 217 selects an output of the continuous inversion data generating circuit 215 in the first initializing operation, or selects an output of the data latching circuit 216 and outputs the selected output data to the output circuit 213 in the normal operation. The output circuit 213 operates on the basis of the output control clocks supplied from the DLL circuit 211, and transmits data received from the output data switching circuit 217 to the DQ bus 102 as a DQ signal.

The command issuer 218 outputs commands, such as the second initializing instruction, and data output instructions, including the OUT0 command and the OUT1 command. Each of the commands is issued such that the rising edge of the base clock signal will be the center of the effective width of the command. For this purpose, the base clock signal is input also to the command issuer 218. In this embodiment, the command issuer 218 issues an initializing signal indicating the shift into the first initializing operation at a rate lower than that of the base clock signal.

The counter 220 of the read control unit 219 counts the number of clocks of the internal clock signals for receiving until a high level data signal is received via the DQ bus 102 after the OUT1 command is issued from the command issuer 218 during the second initializing operation. To be more specific, the counter 220 of the read control unit 219 counts the rising edges of the internal clock signals for receiving until the internal DQ signal (to be discussed hereinafter) is switched to the high level after the command OUT1, which is a pseudo read command, is received from the command issuer 218. The read control unit 219 retains the number of clocks (the number of delay clocks) counted by the counter 220 as set forth above, and uses the number of delay clocks to control the timing for receiving read data (DQ data) thereafter.

The DQ data latching circuit 221 latches the DQ data propagated through the DQ bus 102 according to the base clock signal, and outputs the latched data as an internal DQ signal.

The memory controller 21 constructed as described above most operates as described below.

First, the command issuer 218 transmits the initializing signal onto the command/address bus 101 at a rate lower than that of the base clock signal, and supplies it to the initializing signal generating circuit 214. When the initializing signal is received by a DRAM, the DRAM begins the first initializing operation.

The initializing signal generating circuit 214 generates an internal initializing signal in response to the initializing signal from the command issuer 218, and outputs the internal initializing signal to the continuous inversion data generating circuit 215, the output data switching circuit 217, and the output circuit 213.

In response to the initializing signal, the continuous inversion data generating circuit 215 generates continuous inversion data on which the aforesaid continuous inversion signal will be based, and supplies the generated continuous inversion signal to the output circuit 213 through the intermediary of the output data switching circuit 217 in the first initializing operation.

The output circuit 213 supplies the continuous inversion data as a continuous inversion signal to a particular DQ terminal in synchronization with an output control clock generated by the DLL circuit 211. Thus, as mentioned above, the continuous inversion signal (the pseudo clock signal supplied via a DQ line) is transmitted to the DRAM via the DQ bus (particular DQ line) 102. The continuous inversion signal is used for generating an internal reception clock signal for receiving write data, etc. in the DRAM.

After that, the command issuer 218 issues the second initializing instruction, then issues the OUT0 command. Thus, when a predetermined time elapses, low level data is transmitted from the DRAM through the DQ bus 102. Subsequently, the command issuer 218 issues the OUT1 command, and when a predetermined time passes, high level data that has been transmitted from the DRAM appears on the DQ bus 102. Meanwhile, the DQ data latching circuit 221 latches the data propagated through the DQ bus 102 in conformity with the base clock signal, and outputs the latched data to the read control unit 219 as an internal DQ signal. The counter 220 of the read control unit 219 is triggered by the OUT1 command to start counting the rising edges of the base clock signals, and terminates the counting at an edge where the internal DQ signal switches from the low level to the high level. Thus, the counter 220 is able to acquire the number of clocks (the number of delay clocks) of the base clock signals until the internal DQ signal shifts to the high level after the OUT1 command is issued from the command issuer 218. The number of delay clocks is substantially identical to the number of clocks of the base clock signals that is required from the moment the read command is issued from the command issuer 218 to the moment the data associated with the read command is received. Hence, by utilizing the number of delay clocks, data reading can be properly performed. The number of delay clocks is retained in the read control unit 219.

After the second initializing operation, the read control unit 219 utilizes the number of delay clocks acquired as described above so as to carry out data reading. To be more specific, the read control unit 219 receives the read data (DQ signal) associated with a read command, adjusting to the base clock signal when the number of delay clocks is reached since the command issuer 218 issued the read command.

Figure 15:
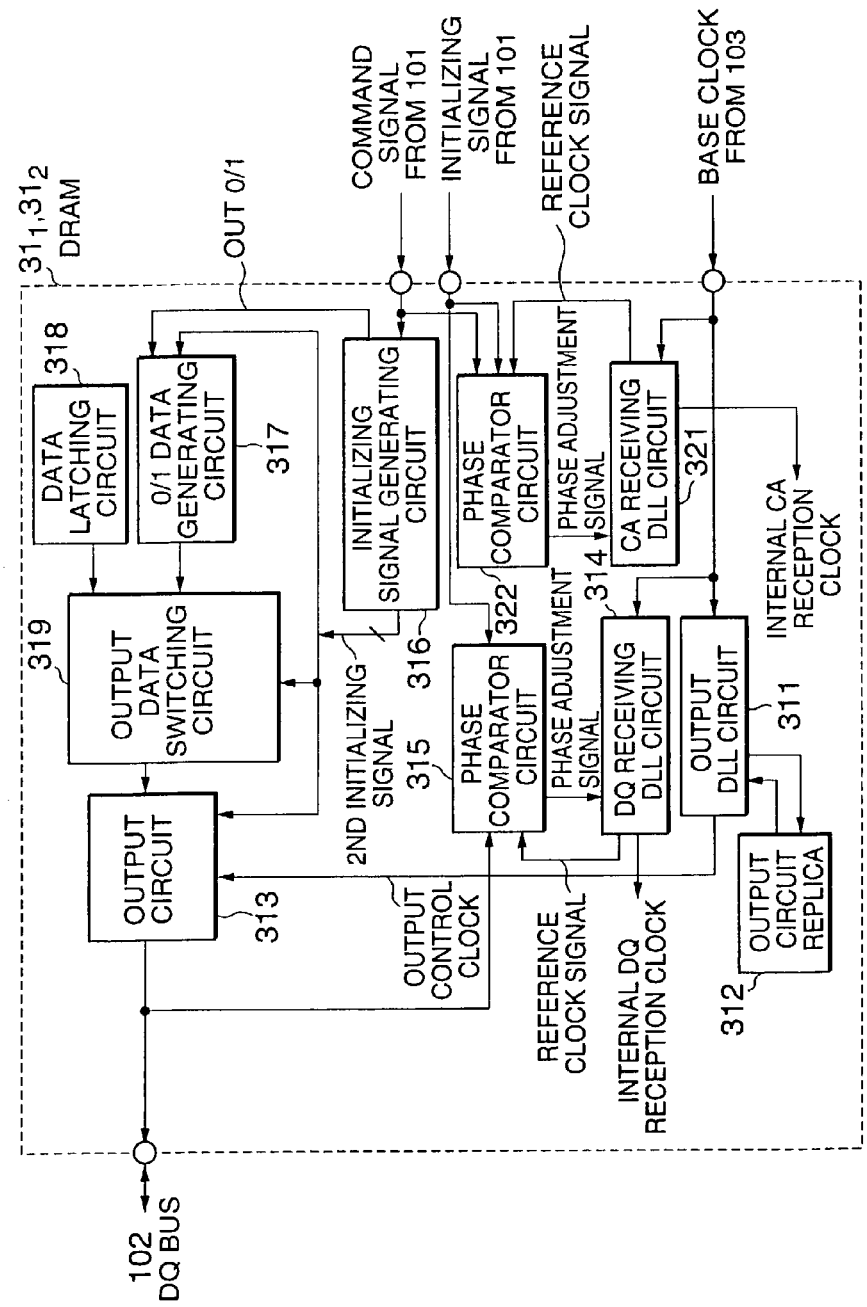
FIG. 15 is a block diagram that shows a modification example of a DRAM shown in FIG. 13 and it shows the configuration of a DRAM capable of generating an internal reception clock signal for a command/address signal.

FIG. 15 shows the construction of a DRAM capable of generating internal clock signals for receiving command/address signals in addition to generating the internal clock signals for receiving DQ data. In the following description, the internal reception clock signal for receiving a command/address signal is referred to as an internal reception clock signal for receiving CA. The internal reception clock signal for receiving DQ data is sometimes referred to as a DQ receiving internal clock. The comparison of FIG. 13 and FIG. 15 indicates that the DRAM shown in FIG. 15 differs from the DRAM shown in FIG. 13 in that it is further equipped with a CA receiving DLL circuit 321 and a phase comparator circuit 322. A DLL circuit 314' for receiving DQ shown in FIG. 15 has a different designation simply to discriminate it from the CA receiving DLL circuit 321 and has the same configuration as the receiving DLL circuit 314 shown in FIG. 13. Hence, the DQ receiving DLL circuit 314' shown in FIG. 15 performs the operation described above in conjunction with the receiving DLL circuit 314.

The DLL circuit 321 for receiving CA controls the phase of a base clock signal on the basis of a phase adjustment signal from the phase comparator circuit 322 to generate a internal reception clock signal for comparison in the phase comparator circuit 322 and an internal reception clock signal for receiving CA in the DRAM. The phase comparator circuit 322 generates a phase adjustment signal for adjusting the phase so as to bring the phase difference between the internal reception clock signal output from the DLL circuit 321 for receiving CA and the pseudo clock signal (continuous inversion signal) received via the command/address bus 101 to zero, and supplies the generated phase adjustment signal to the DLL circuit 321 for receiving CA. The phase adjustment signal generated by the phase comparator circuit 322 is the same as that generated by, for example, the phase comparator circuit 203 (refer to FIG. 6) in the first embodiment. In this embodiment, the phase comparator circuit 322 turns ON in response to the initializing signal.

EXAMPLE 4

The concept of the memory system according to the third embodiment described above can be applied also to a case where a DQ line (a bundle of DQ lines) for each byte or word is provided, and a clock signal line for transmitting a base clock signal is provided, corresponding to each DQ line (a bundle of DQ lines).

The memory system according to a fourth embodiment is an example in which the total bit width of the DQ bus in the memory system according to the foregoing third embodiment has been expanded, and related to a DRAM system having a general module construction.

Figure 16:
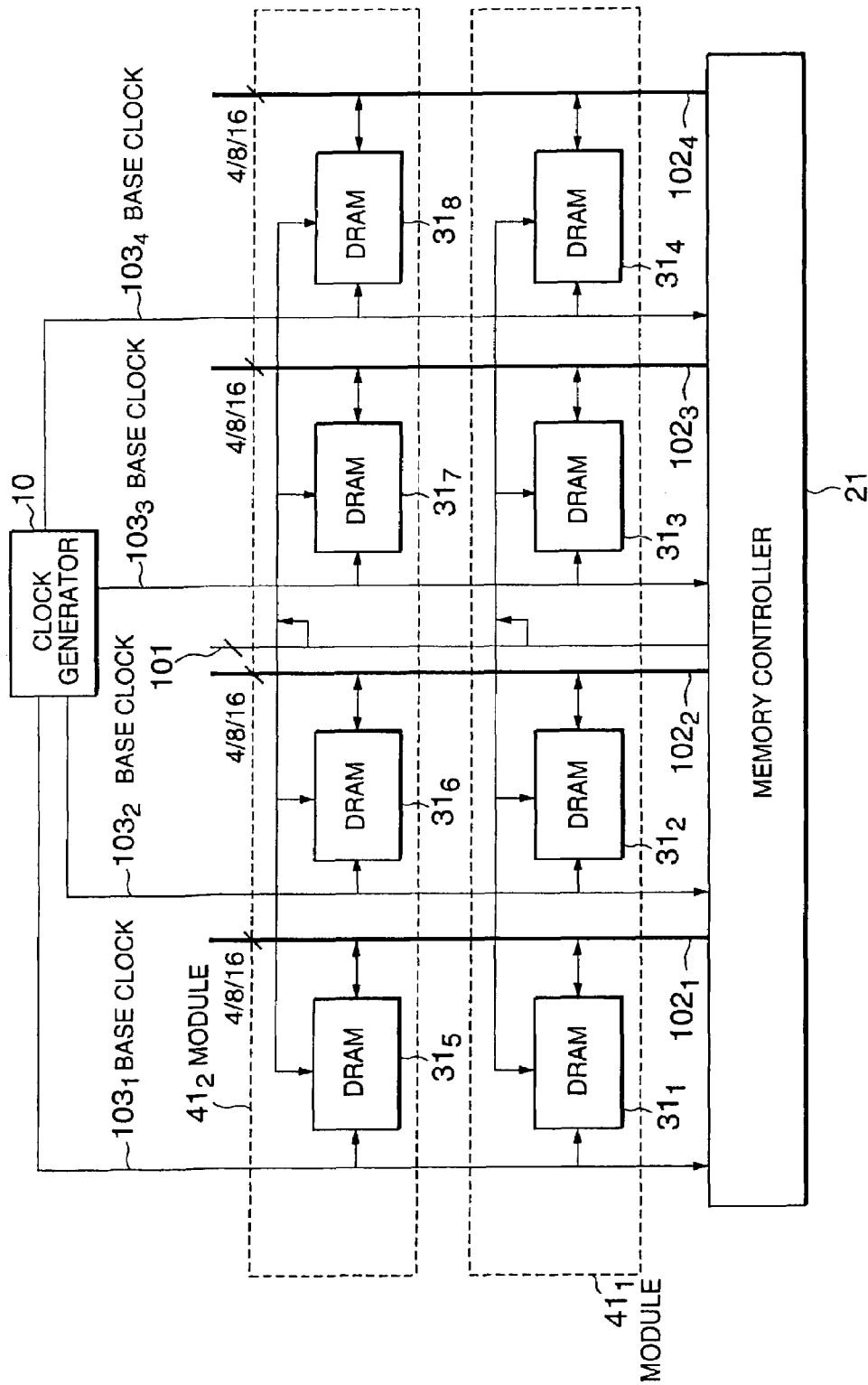
FIG. 16 is a diagram showing a schematic configuration of a memory system according to a fourth embodiment of the present invention.

Referring to FIG. 16, in this embodiment, DRAMs $31_1$ through $31_4$ are provided on a module $41_1$, and DRAMs $31_5$ through $31_8$ are provided on a module $41_2$. The bundles of DQ lines $102_1$ through $102_4$ constituting a DQ bus are provided for each pair of DRAMs $31_1$ and $31_5$, DRAMs $31_2$ and $31_6$, DRAMs $31_3$ and $31_7$, and DRAMs $31_4$ and $31_8$. Clock signal lines $103_1$ through $103_4$ for transmitting base clock signals are also provided in association with the bundles of DQ lines $102_1$ through $102_4$. Signal lines $104_1$ through $104_4$ for transmitting initializing signals are provided in association with the bundles of DQ lines $102_1$ through $102_4$. A command/address bus 101 is shared by the DRAMs $31_1$ through $31_4$ and $31_5$ through $31_8$ arranged in parallel.

In the memory system constructed as described above, the aforesaid first and second initializing procedures are carried out on all the DRAMs $31_1$ through $31_8$. As a result, the phase differences between internal clock signals for receiving that are generated in the DRAMs 311 through $31_8$ and the base clock signals in the DRAMs $31_1$ through $31_8$ as the initializing data are retained in the DRAMs $31_1$ through $31_8$. Meanwhile, the number of delay clocks related to the receipt of read data from the DRAMs $31_1$ through $31_8$ is retained in the memory controller 21. In this memory system, by using corresponding DQ lines and clock signal lines, the aforesaid first and second initializing procedures can be simultaneously carried out on the DRAMs $31_1$ through $31_4$ arranged in parallel. Similarly, the first and second initializing procedures can be simultaneously carried out on the DRAMs $31_5$ through $31_8$ arranged in parallel.

Figure 17:
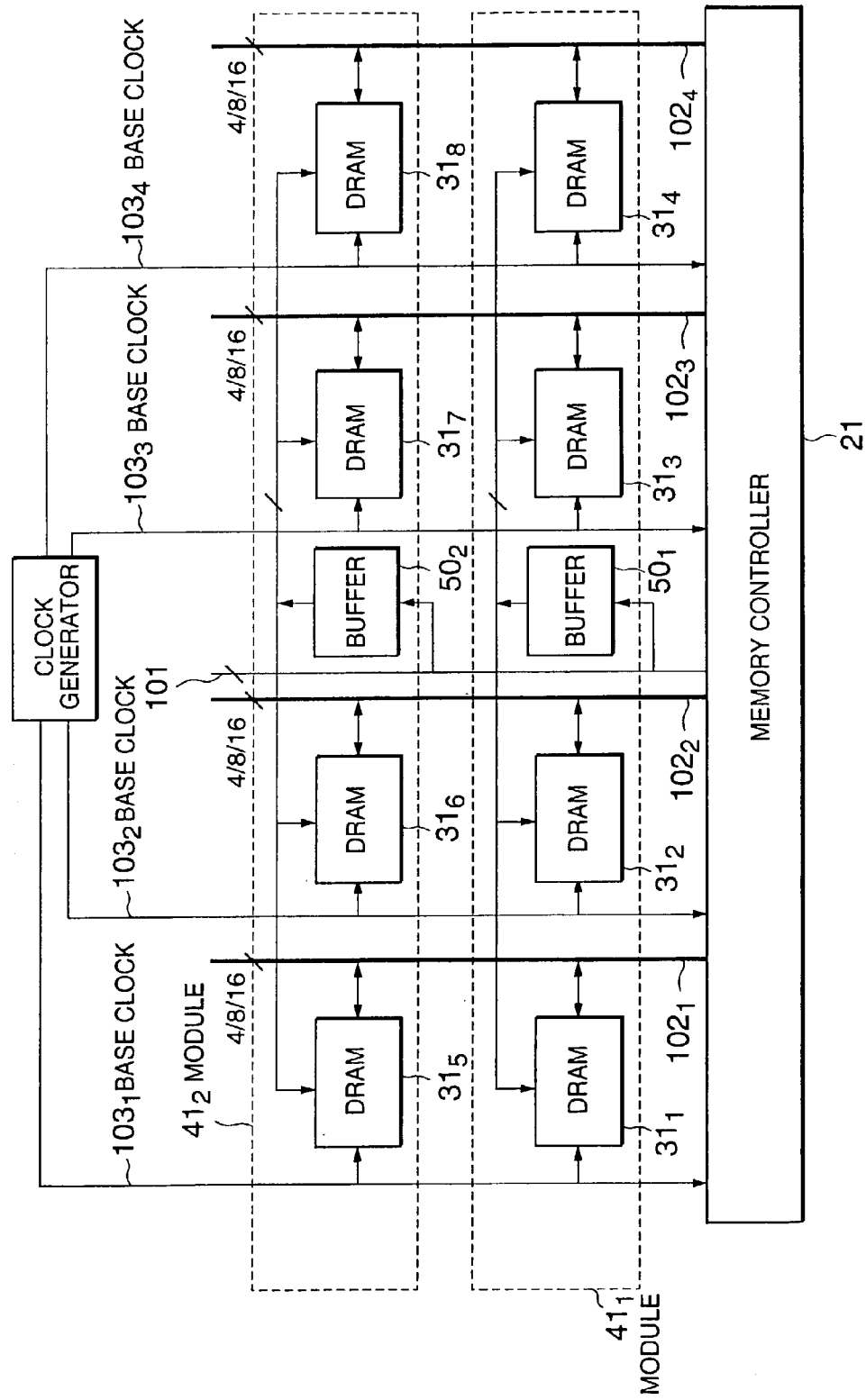
FIG. 17 is a diagram showing a modification example of the memory system according to the fourth embodiment of the present invention.

This embodiment can be applied also to a buffered type DRAM system, as shown in FIG. 17. In this case, command/address signals supplied via the command/address bus 101 are temporarily retained by buffers $50_1$ and $50_2$ provided on modules $41_1$ and $41_2$, then distributed to the DRAMs $31_1$ through $31_4$ and $31_5$ through $31_8$ on the corresponding modules $41_1$ and $41_2$. In the DRAMs $31_1$ through $31_8$, the command/address signals distributed from the buffers $50_1$ and $50_2$ are received by using the internal clocks for receiving command/address signals.

Furthermore, in the foregoing DRAM system, a parity DQ bit line may be provided for each byte. For example, in the DRAM system shown in FIG. 16 or FIG. 17, if a DQ lane of 8 bits or 16 bits includes a parity, then there will be 9 bits or 18 bits, respectively.

In this embodiment also, the internal clock signals for receiving CA may be generated in each DRAM to receive command/address signals by using the generated internal clock signals.

It is needless to say that a clock signal line can be provided for each memory device also in the memory system having the general module construction as described above.

In the DRAM system shown in FIG. 16 or FIG. 17, data writing timed to the base clock signal is possible by carrying out the aforesaid first initializing procedure, and data reading will be properly performed by carrying out the second initializing procedure. If the propagation delay or the like with respect to each DRAM has been accurately acquired in advance by simulation or the like as described in the third embodiment, then the second initializing procedure may be omitted. In this embodiment also, the compensation for cross talk (for the DQ signals and/or command/address signals) in the propagation of a pseudo clock signal, as explained in the third embodiment, can be performed.

EXAMPLE 5

Figure 18:
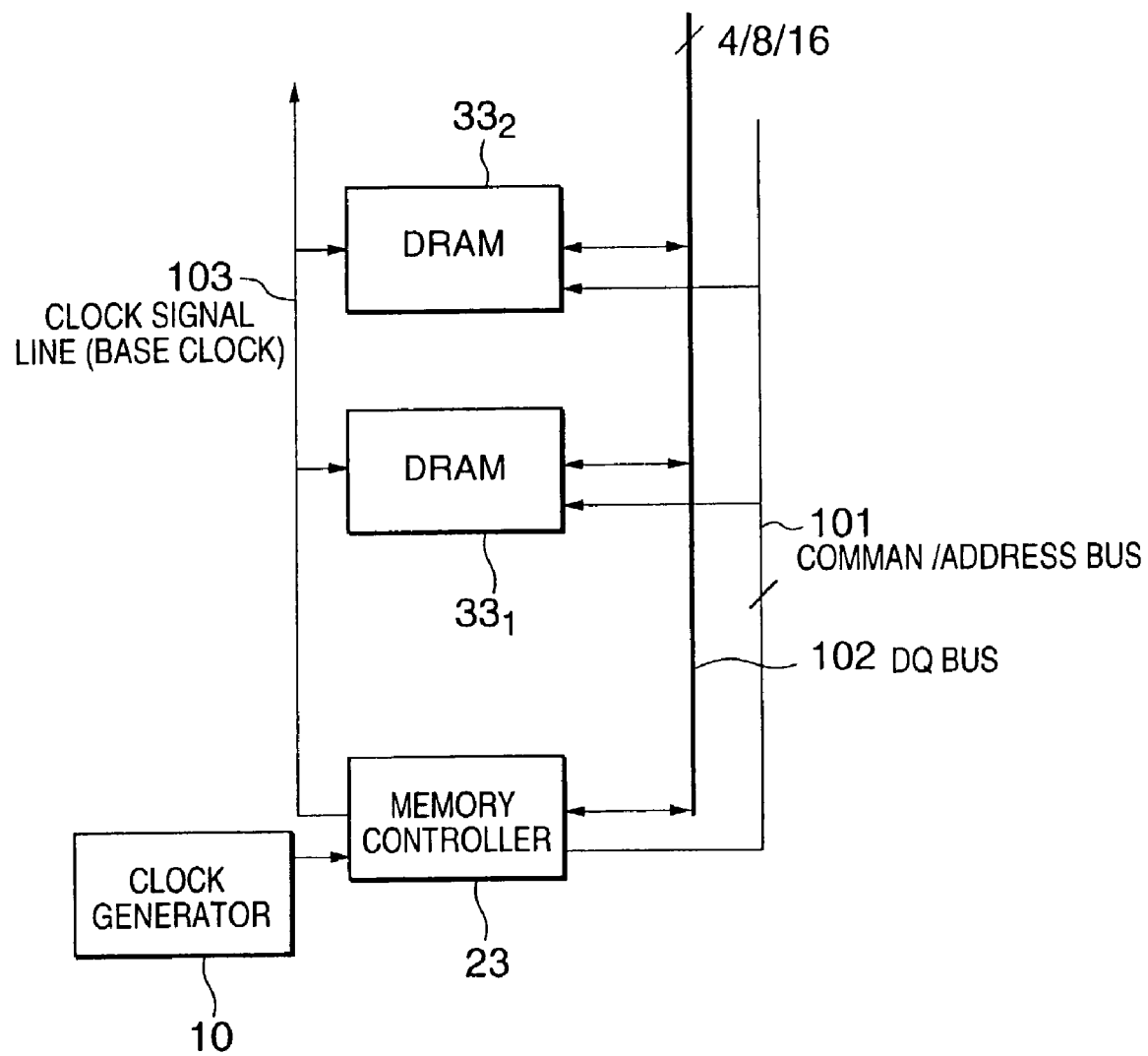
FIG. 18 is a diagram showing a schematic configuration of a memory system according to a fifth embodiment of the present invention.

In the first embodiment described above, the problem with the receiving timing margin caused by the difference in propagation time between the read clock and the DQ signal can be solved. A fifth embodiment in accordance with the present invention combines the concept of the foregoing third embodiment with the first embodiment so as to improve the receiving timing margin caused by the difference in the propagation time between a clock signal and a DQ signal at the time of writing data in the transmission of data from the memory controller 20 to the DRAM $30_1$ or $30_2$. As shown in FIG. 18, the schematic configuration of the memory system according to this embodiment is similar to the schematic configuration in the first embodiment. However, in order to perform a distinctive operation according to this embodiment, the DRAM $33_1$ or $33_2$ and a memory controller 23 have different configurations from those shown in the first embodiment (to be discussed hereinafter).

In the fifth embodiment, the memory controller 23 transmits DQ data in a write mode such that its center is timed to a base clock. However, the timing margin on a receiving side reduces due to a difference between a DQ signal and a clock signal in signal propagation time attributable to a wiring layout, signal drivability, the difference in electrical termination method, etc. in a system. Hence, the DRAM corrects the deviation of timing from the base clock signal by generating an internal reception clock signal for receiving the DQ signals at the DRAM during the initialization.

The procedure for generating the internal reception clock signal for receiving the DQ signals in the DRAM is practically the same as that in the third embodiment described above.

To be more specific, the memory controller 23 first issues an initializing instruction at a lower rate than that of the base clock signal to the DRAM $33_2$ via a command/address bus 101, and also starts the first initializing operation itself. Upon receipt of the initializing signal, the DRAM $33_2$ sets itself in a standby mode for receiving a continuous inversion signal (pseudo clock signal). The moment the first initializing operation is begun, the memory controller 23 outputs a continuous inversion signal matched to the center of the base clock signal to a particular DQ terminal (refer to the base clock@MC and DQ@MC in FIG. 19). As is obvious from FIG. 19, in this embodiment, the output timing of the continuous inversion signal is the same timing as the timing at which the memory controller 23 outputs the DQ signal in the normal operation. More specifically, the memory controller 23 outputs the continuous inversion signals at the rise and/or fall of the base clock signal. When the DRAM $33_2$ receives the continuous inversion signal as a pseudo clock signal (refer to DQ@DRAM in FIG. 19), it backs up the phase of the received pseudo clock signal (continuous inversion signal) by 90 degrees so as to generate the internal reception clock signal at the DRAM $33_2$ (refer to the receiving internal clock@DRAM in FIG. 19). Thus, the DRAM $33_2$ generates an internal reception clock signal that has a phase optimum for receiving write data (DQ signal) during the normal operation. The DRAM $33_2$ retains the phase difference between the internal reception clock signal and the base clock signal, so that it can maintain the generation of the internal reception clock signal after the first initializing procedure is terminated (after the internal reception clock signal is generated).

Particularly in this embodiment, the continuous inversion signals as the pseudo clock signals are transmitted from the memory controller 23 to the DRAM $33_2$ by using two particular DQ lines among a plurality of DQ lines constituting the DQ bus 102. The continuous inversion signals transmitted over the two DQ lines are complementary to each other. This makes it possible to improve the accuracy of timing for generating the internal reception clock signal at the DRAM $33_2$.

Figure 20:
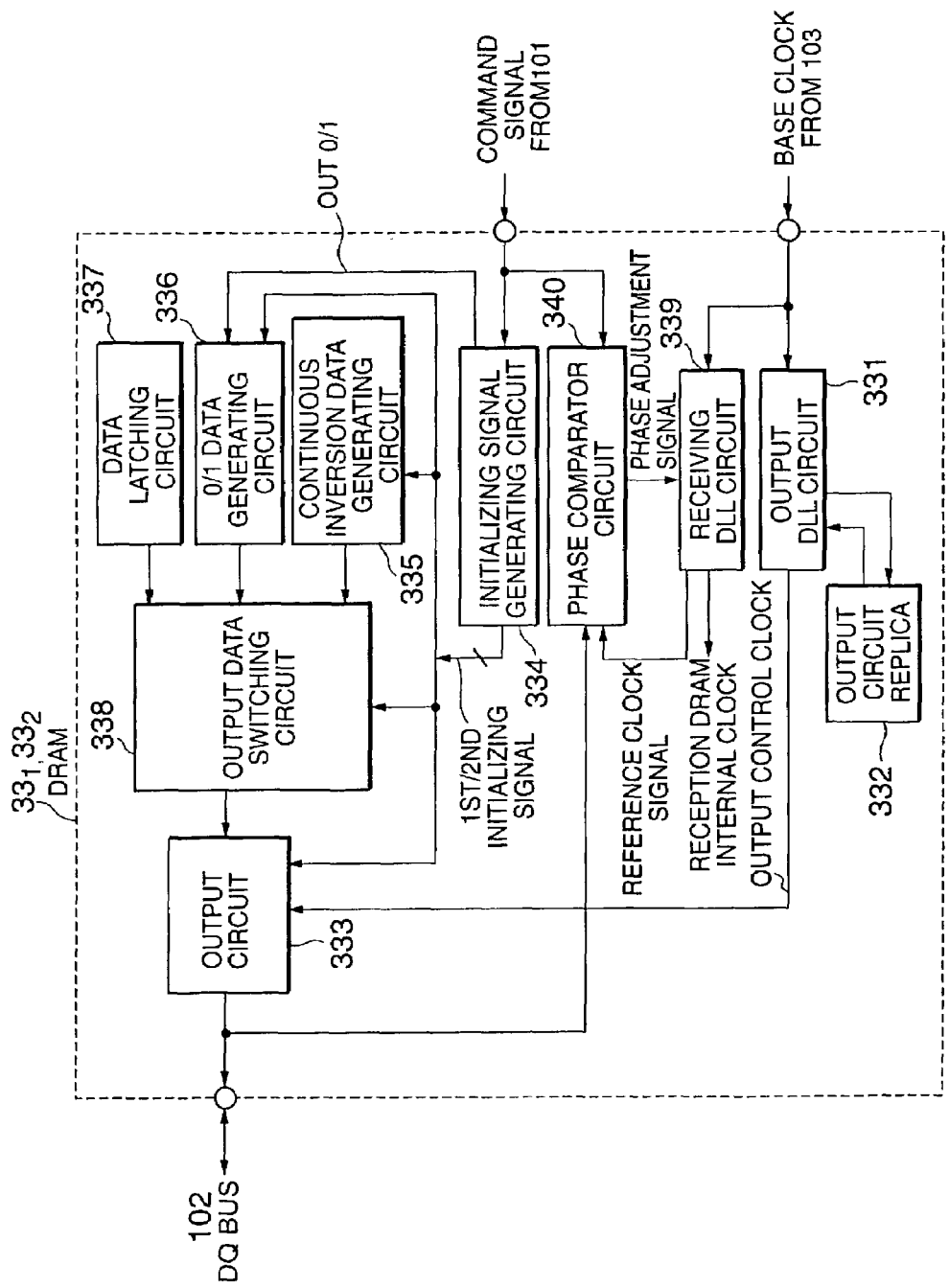
FIG. 20 is a diagram showing a configuration of a DRAM that permits the implementation of the calibration method according to the fifth embodiment of the present invention.
Figure 21:
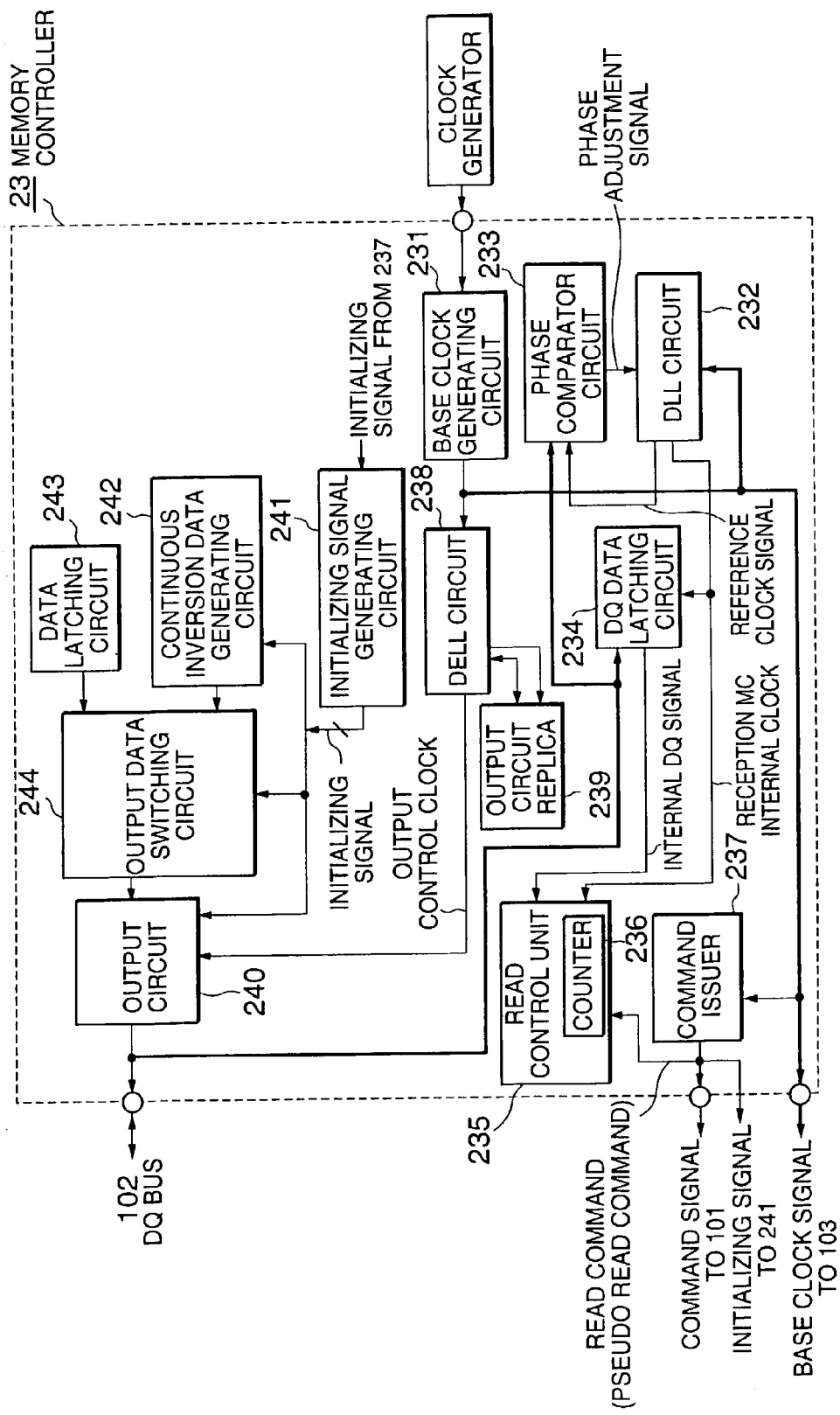
FIG. 21 is a diagram showing a configuration of a memory controller that permits the implementation of the calibration method according to the fifth embodiment of the present invention.
Figure 22:
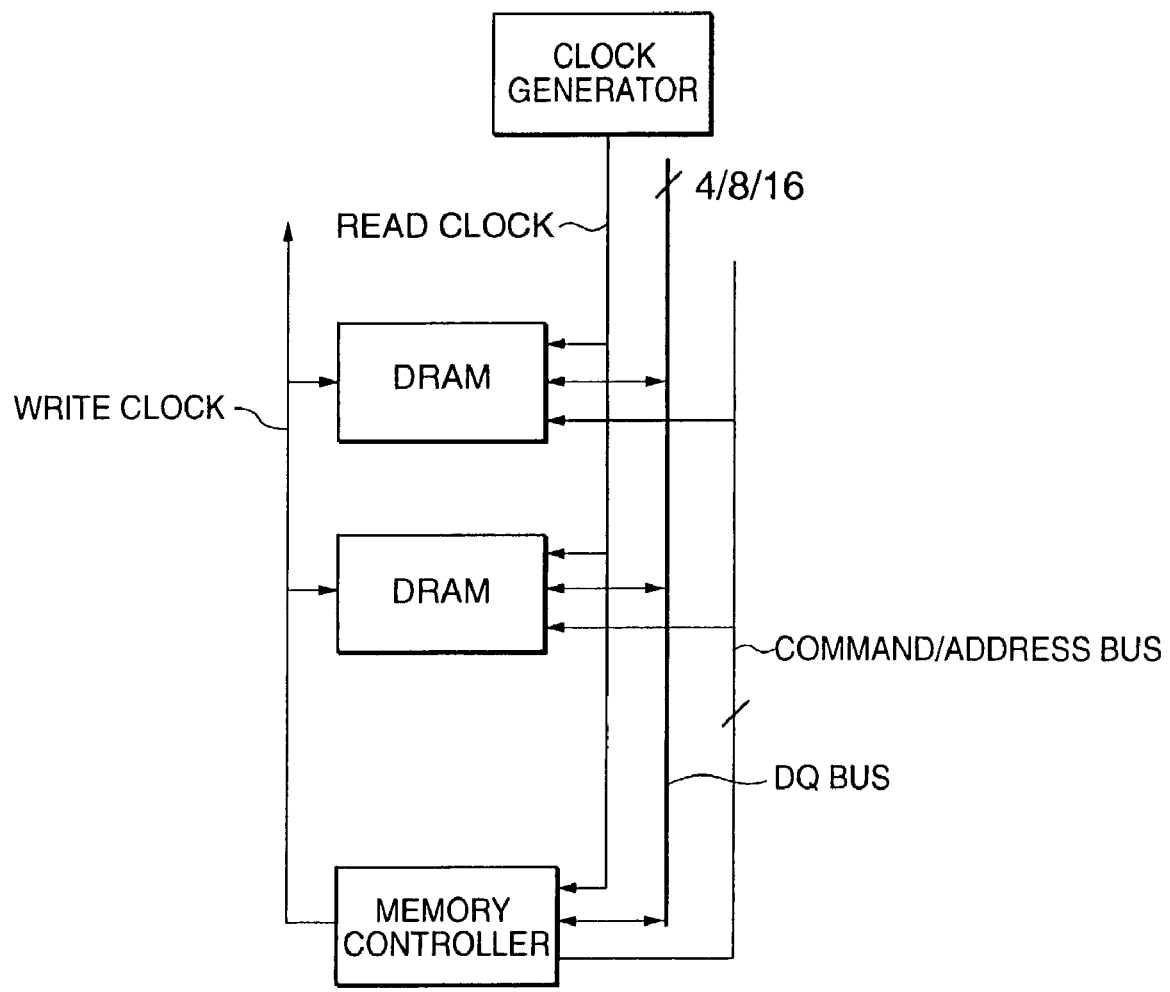
FIG. 22 is a diagram showing a schematic configuration of a memory system according to the related technology 1.
Figure 23:
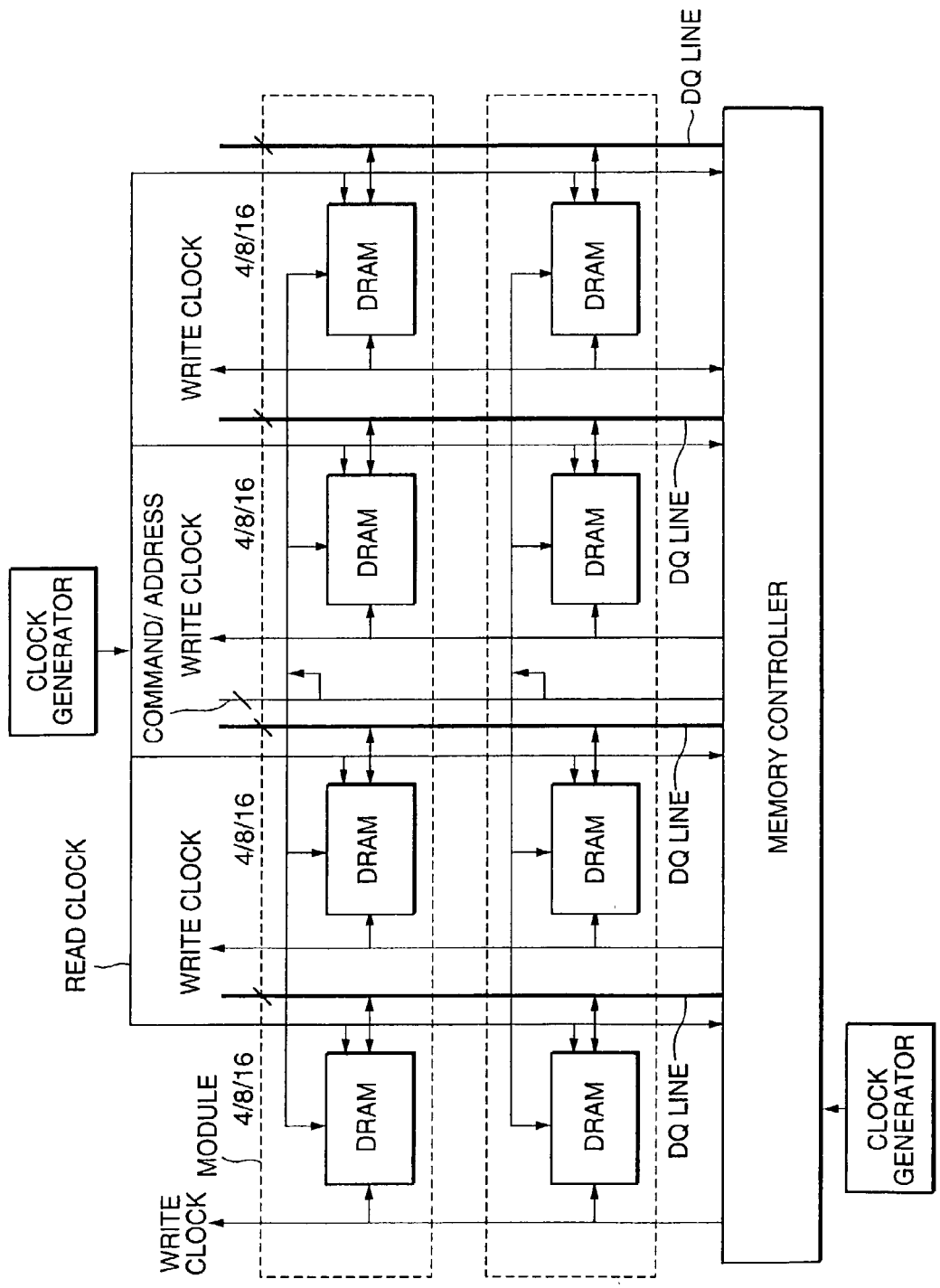
FIG. 23 is a diagram showing a schematic configuration of a memory system according to the related technology 2.

FIG. 20 and FIG. 21 are block diagrams showing the schematic configurations of DRAMs and memory controllers capable of implementing the aforesaid first and second initializing procedures in the foregoing first embodiment and the initializing procedure (the procedure for generating an internal reception clock signal for receiving the DQ signals at the DRAM) in the present embodiment described above.

Referring to FIG. 20, the DRAM ($33_1$ or $33_2$) is equipped with an output DLL circuit 331, an output circuit replica 322, an output circuit 333, an initializing signal generating circuit 334, a continuous inversion data generating circuit 335, a 0/1 data generating circuit 336, a data latching circuit 337, an output data switching circuit 338, a receiving DLL circuit 339, and a phase comparator circuit 340. Of these components, the output DLL circuit 331, the output circuit replica 322, the output circuit 333, the initializing signal generating circuit 334, the continuous inversion data generating circuit 335, the 0/1 data generating circuit 336, the data latching circuit 337, and the output data switching circuit 338 have the same configurations of the DLL circuit 301, the output circuit replica 302, the output circuit 303, the initializing signal generating circuit 304, the continuous inversion data generating circuit 305, the 0/1 data generating circuit 306, the data latching circuit 307, and the output data switching circuit 308 in the first embodiment (refer to FIG. 5). On these components, therefore, the same operations as those explained in the first embodiment will be performed. The receiving DLL circuit 339 and the phase comparator circuit 340 have the same configurations as those of the receiving DLL circuit 314 and the phase comparator circuit 315 in the third embodiment (refer to FIG. 13). On these components, therefore, the same operations as those explained in the third embodiment will be performed. The DRAM 331 or 332 may be further provided with the DLL circuit 321 for receiving CA and the phase comparator circuit 322 shown in FIG. 15 to receive command/address signals.

Referring now to FIG. 21, the memory controller 23 is equipped with a base clock generating circuit 231, a DLL circuit 232, a phase comparator circuit 233, a DQ data latching circuit 234, a read control unit 235, a command issuer 237, a DLL circuit 238, an output circuit replica 239, an output circuit 240, an initializing signal generating circuit 241, a continuous inversion data generating circuit 242, a data latching circuit 243, and an output data switching circuit 244. The read control unit 235 is equipped with a counter 236 for a second initializing operation.

Of the above components, the base clock generating circuit 231, the DLL circuit 232, the phase comparator circuit 233, the DQ data latching circuit 234, the read control unit 235, and the counter 236 have the same configurations as those of the base clock generating circuit 201, the DLL circuit 202, the phase comparator circuit 203, the DQ data latching circuit 204, the read control unit 205, and the counter 206 in the first embodiment (refer to FIG. 6). On these components, therefore, the same operations as those explained in the first embodiment will be performed. The DLL circuit 238, the output circuit replica 239, the output circuit 240, the initializing signal generating circuit 241, the continuous inversion data generating circuit 242, the data latching circuit 243, and the output data switching circuit 244 have the same configurations as those of DLL circuit 211, the output circuit replica 212, the output circuit 213, the initializing signal generating circuit 214, the continuous inversion data generating circuit 215, the data latching circuit 216, and the output data switching circuit 217 in the third embodiment (refer to FIG. 14). On these components, therefore, the same operations as those explained in the third embodiment will be performed. The command issuer 237 combines the function of the command issuer 218 in the first embodiment and the function of the command issuer 237 in the third embodiment, and issues the first initializing signal explained in the third embodiment, then issues the first and second initializing instructions or the like explained in the first embodiment.

Figure 19:
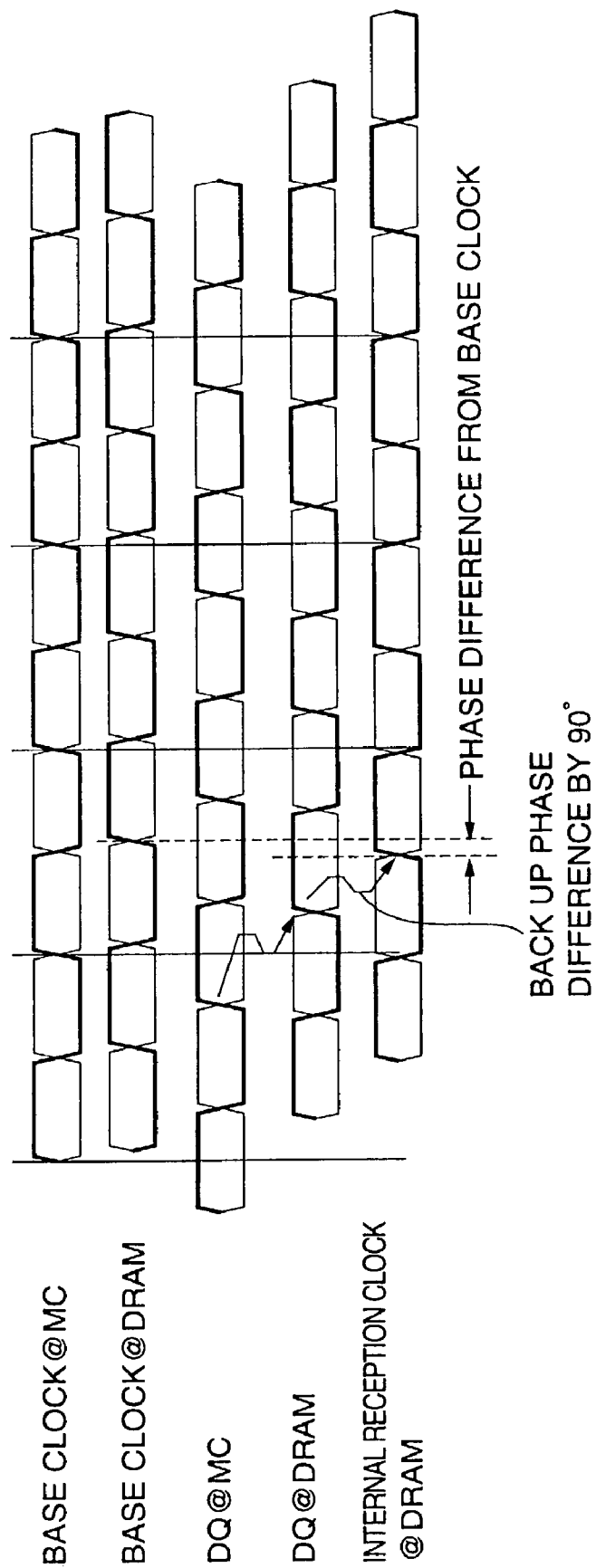
FIG. 19 is a timing chart showing an initializing procedure in a calibration method according to the fifth embodiment of the present invention.

In this embodiment, the phase difference adjusted in the DRAM is only the difference in propagation time between the base clock and the DQ signal, which is small, as shown in FIG. 19. However, the small phase difference occupying a frequency increases as the clock frequency becomes higher, possibly causing the problem of a reduction in the receiving timing margin. In this respect, the memory system according to this embodiment is advantageously adopted.

As described above, according to the present invention, when a signal is transmitted or received on a predetermined signal path in a system wherein a transmitting apparatus and a receiving apparatus operate on the basis of a single base clock signal, an internal reception clock signal for receiving a signal that takes into account the propagation delay of a signal on a predetermined signal path in the receiving apparatus is generated, and the signal is received through the predetermined signal path on the basis of the internal clock for receiving the signal. This restrains the problem in that the timing margin reduces in receiving a signal in the receiving apparatus.

Furthermore, according to the present invention, the number of clock signals can be reduced, as compared with the related technologies. Especially in the case of a system of plural bytes in which DRAMs are mounted on a module in parallel, the number of pins of the module can be reduced, permitting the cost of the system to be reduced.

Moreover, according to the present invention, the internal reception clock signal for receiving a DQ signal or the internal reception clock signal for receiving an address/command signal are generated by using the DQ signal itself or the address/command signal itself, and the DQ signal or the address/command signal is received by using the generated internal clock signals. Hence, the difference in timing among the clock signals, the DQ signals, and the address/command signals attributable to the difference in topology and physical layout among the clock signal lines, the DQ bus, and the address/command bus can be calibrated, making it possible to construct a system featuring a wider receiving timing margin.

In addition, to generate the internal reception clock signal for receiving the DQ signal, complementary continuous inversion signal is transmitted as the initializing DQ signal to two DQ signal lines. This allows the continuous inversion signal acting as a pseudo clock signal to be handled more precisely. Hence, variations in timing caused by fluctuation of a reference potential can be avoided, as compared with a case where a single DQ signal line (a single continuous inversion signal) is used to generate the internal reception clock signal, thus allowing the internal reception clock signal to be generated with higher accuracy.

What is claimed is:

1. A calibration method for use in a memory system comprising a memory controller and a semiconductor memory device to perform signal transmission between the semiconductor memory device and the memory controller in accordance with a reference clock signal and to adaptively receive a DQ signal from the semiconductor memory device by the memory controller, comprising:
   a first step of transmitting a continuous and alternate inversion signal as an initializing DQ signal to a DQ bus from the semiconductor memory device in accordance with a reference clock signal with a phase of the reference clock signal adjusted; and
   a second step of generating an internal reception clock signal in the memory controller in response to the initializing DQ signal, with a phase difference kept in relation to the initializing DQ signal received by the memory controller,
   wherein the memory controller receives the DQ signal from the semiconductor memory device on the basis of the internal reception clock signal.

2. The calibration method according to claim 1, wherein the second step is implemented by using a DLL circuit, and the phase difference between the internal reception clock signal and the reference clock signal in the memory controller is retained in the DLL circuit so as to keep the generation of the internal reception clock signal by the DLL circuit.

3. The calibration method according to claim 1, wherein the first step comprises the step of transmitting the continuous and alternate inversion signal through a particular single DQ line selected among DQ lines constituting the DQ bus, and the second step comprises the step of generating the internal reception clock signal on the basis of the continuous and alternate inversion signal received through the particular single DQ line.

4. The calibration method according to claim 2, wherein the first step comprises the step of transmitting the continuous and alternate inversion signal through a particular single DQ line selected among DQ lines constituting the DQ bus, and the second step comprises the step of generating the internal reception clock signal on the basis of the continuous and alternate inversion signal received through the particular single DQ line.

5. The calibration method according to claim 3, wherein the first step comprises the step of driving, after transmission of the continuous and alternate inversion signal to the particular single DQ line, the DQ lines other than the particular single DQ line so that signals transmitted to adjoining DQ lines are inverted to each other.

6. The calibration method according to claim 1, wherein the first step comprises the steps of selecting two particular DQ lines among DQ lines constituting the DQ bus and transmitting mutually complementary continuous and alternate inversion signals to the particular two DQ lines, and the second step comprises the step of generating the internal reception clock signal on the basis of the complementary continuous and alternate inversion signal.

7. The calibration method according to claim 2, wherein the first step comprises the steps of selecting two particular DQ lines among DQ lines constituting the DQ bus and transmitting mutually complementary continuous and alternate inversion signals to the particular two DQ lines, and the second step comprises the step of generating the internal reception clock signal on the basis of the complementary continuous and alternate inversion signal.

8. The calibration method according to claim 6, wherein the second step comprises the steps of transmitting the complementary continuous and alternate inversion signals to the particular two DQ lines among the DQ lines constituting the DQ bus, and driving the DQ lines other than the particular two DQ lines so that the signals transmitted to adjoining DQ lines are inverted against each other.

9. The calibration method according to claim 7, wherein the second step comprises the steps of transmitting the complementary continuous and alternate inversion signals to the particular two DQ lines among the DQ lines constituting the DQ bus, and driving the DQ lines other than the particular two DQ lines so that the signals transmitted to adjoining DQ lines are inverted against each other.

10. The calibration method according to claim 1, further comprising:
    a third step of issuing a reference DQ data output instruction from the memory controller for the semiconductor memory device;
    a fourth step of transmitting, from the semiconductor memory device to a DQ bus, a reference DQ data signal associated with the reference DQ data output instruction; and
    a fifth step of counting, in the memory controller, the number of clocks until the reference DQ data signal is received by the internal reception clock signal to retain the count result as the number of delay clocks.

11. The calibration method according to claim 10, wherein the memory controller receives the DQ signal transmitted to a DQ bus from the semiconductor memory device by the internal reception clock signal in consideration of the number of delay clocks.

12. A memory system for use in adaptively performing signal transmission between a semiconductor memory device and a memory controller in accordance with a reference clock signal, wherein
    the semiconductor memory device comprises an initializing DQ signal transmitting means, responsive to the reference clock signal, for transmitting a continuous and alternate inversion signal as an initializing DQ signal to a DQ bus, with a phase of the continuous and alternate inversion signal adjusted to that of the reference clock signal, and
    the memory controller comprises an internal reception clock signal generating means for generating an internal reception clock signal such that it has a predetermined phase difference with respect to the initializing DQ signal received by the memory controller;
    the memory controller receiving the DQ signal from the semiconductor memory device on the basis of the internal reception clock signal.

13. The memory system according to claim 12, wherein the is internal reception clock signal generating means comprises a phase difference retaining means for retaining a phase difference between the a1 internal reception clock signal and the reference clock signal in the memory controller;

the memory controller continuously generating the internal reception clock signal with reference to the reference clock signal on the basis of the phase difference retained in the phase difference retaining means.

14. The memory system according to claim 12, wherein the initializing DQ signal transmitting means transmits mutually complementary continuous and alternate inversion signals as the initializing DQ signals by the use of two particular DQ lines among DQ lines constituting the DQ bus, and
the receiving internal clock generating means receives the initializing DQ signals that are the complementary continuous and alternate inversion signals through the two particular DQ lines, and generates the internal reception clock signal on the basis of the initializing DQ signals.

15. The memory system according to claim 13, wherein the initializing DQ signal transmitting means transmits mutually complementary continuous and alternate inversion signals as the initializing DQ signals by the use of two particular DQ lines among DQ lines constituting the DQ bus, and
the receiving internal clock generating means receives the initializing DQ signals that are the complementary continuous and alternate inversion signals through the two particular DQ lines, and generates the internal reception clock signal on the basis of the initializing DQ signals.

16. The memory system according to claim 12, wherein the memory controller further comprises a DQ data output instruction means for issuing a reference DQ data output instruction to the semiconductor memory device after generating the internal reception clock signal, and a delay clock number retaining means for the number of clocks until a reference DQ data signal that corresponds to the reference DQ data output instruction is received from the semiconductor memory device according to the internal reception clock signal, to retain the count result as the number of delay clocks, and
wherein the semiconductor memory device further comprises a data output means for transmitting the reference DQ data signal to the DQ bus in response to the reference DQ data output instruction.

17. The memory system according to claim 16, wherein the memory controller receives the DQ signal transmitted through the DQ bus from the semiconductor memory device by the internal reception clock signal in consideration of the number of the delay clocks.

18. The memory system according to claim 12, wherein a clock signal line for transmitting the reference clock signal is provided for the DQ lines of each byte or word.

19. The memory system according to claim 18, comprising a parity DQ bit line for each byte.

20. A calibration method for use in a memory system which adaptively performs signal transmission between a memory controller and a semiconductor memory device in accordance with a reference clock signal, the calibration method being for properly receiving a DQ signal from the semiconductor memory device by the memory controller, wherein
the memory controller carries out:
a first initializing step of receiving, as a pseudo clock signal, an is initializing DQ signal formed by a continuous and alternate inversion signal from the semiconductor memory device, to generate an internal reception clock signal from the initializing DQ signal; and a second initializing step of counting the number of the internal reception clock signal from the moment a reference DQ data output instruction is issued to the semiconductor memory device to the moment a reference DQ data signal is received from the semiconductor memory device as the DQ data signal that corresponds to the reference DQ data output instruction, to retain the count result as the number of delay clocks;
the second initializing step being followed by receiving a DQ signal transmitted from the semiconductor memory device through the DQ bus by the internal reception clock signal in consideration of the number of the delay clocks.

21. A calibration method for use in a memory system which adaptively performs signal transmission between a memory controller and a semiconductor memory device in accordance with a reference clock signal, the calibration method being for properly receiving a DQ signal from the semiconductor memory device by the memory controller, comprising:
a first step of transmitting a continuous and alternate inversion signal as an initializing DQ signal from the memory controller through a DQ bus, with a phase of the continuous and alternate inversion signal adjusted to that of the reference clock signal; and
a second step of generating, in the semiconductor memory device, an internal reception clock signal such that it has a predetermined phase difference with respect to the initializing DQ signal received,
wherein the memory controller receives the DQ signal from the semiconductor memory device on the basis of the internal reception clock signal.

22. The calibration method according to claim 21, wherein the second step is implemented by using a DLL circuit, and the phase difference between the internal reception clock signal and the reference clock signal in the semiconductor memory device is retained in the DLL circuit thereby to maintain the generation of the internal reception clock signal by the DLL circuit.

23. The calibration method according to claim 21, wherein the first step transmits a continuous and alternate inversion signal through a particular single DQ line selected among DQ lines constituting the DQ bus, and the second step generates the internal reception clock signal on the basis of the continuous inversion signal.

24. The calibration method according to claim 22, wherein the first step transmits a continuous and alternate inversion signal through a particular single DQ line selected among DQ lines constituting the DQ bus, and the second step generates the internal reception clock signal on the basis of the continuous inversion signal.

25. The calibration method according to claim 23, wherein the first step comprises the step of driving, after transmission of the continuous and alternate inversion signal to the particular single DQ line, the DQ lines constituting the DQ bus other than the particular single DQ line so that signals transmitted to adjoining DQ lines are inverted to each other.

26. The calibration method according to claim 24, wherein the first step comprises the step of driving, after transmission of the continuous and alternate inversion signal to the particular single DQ line, the DQ lines constituting the DQ bus other than the particular single DQ line so that signals transmitted to adjoining DQ lines are inverted to each other.

27. The calibration method according to claim 21, wherein the first step transmits complementary continuous and alternate inversion signals to two particular DQ lines selected among DQ lines constituting the DQ bus and the second step generates the internal reception clock signal on the basis of the complementary continuous and alternate inversion signal.

28. The calibration method according to claim 22, wherein the first step transmits complementary continuous and alternate inversion signals to two particular DQ lines selected among DQ lines constituting the DQ bus and the second step generates the internal reception clock signal on the basis of the complementary continuous and alternate inversion signal.

29. The calibration method according to claim 27, wherein the second step drives, after transmission of the complementary continuous and alternate inversion signals to the two particular DQ lines among the DQ lines constituting the DQ bus, the DQ lines other than the two particular DQ lines so that signals transmitted to adjoining DQ lines are inverted to each other.

30. The calibration method according to claim 28, wherein the second step drives, after transmission of the complementary continuous and alternate inversion signals to the two particular DQ lines among the DQ lines constituting the DQ bus, the DQ lines other than the two particular DQ lines so that signals transmitted to adjoining DQ lines are inverted to each other.

31. The calibration method according to claim 21, wherein the memory controller further comprises:
a third step of issuing a reference DQ data output instruction from the memory controller to the semiconductor memory device;
a fourth step of transmitting a reference DQ data signal associated with the reference DQ data output instruction from the semiconductor memory device to the DQ bus; and
a fifth step of counting, in the memory controller, the number of clocks until the reference DQ data signal is received according to the internal reception clock signal, to retain the count result as the number of delay clocks, and
wherein the memory controller issues a read command, then receives, from the semiconductor memory device, the read data associated with the read command as a DQ signal according to the reference clock signal, in consideration of the number of the delay clocks.

32. The calibration method according to claim 21, comprising:
a third step of transmitting, from the memory controller, a continuous and alternate inversion signal as an initializing command/address signal to a command/address bus, with a phase of the initializing command/address signal adjusted to that of the reference clock signal phase; and
a fourth step of generating, in the semiconductor memory device, internal reception clock signal of the command/address signal such that it has a predetermined phase difference with respect to the initializing command signal or the initializing address signal received by the semiconductor memory device,
wherein the semiconductor memory device receives a command/address signal from the memory controller on the basis of the internal reception clock signal of the command/address signal.

33. The calibration method according to claim 32, wherein the fourth step is implemented by using a DLL circuit, and the phase difference between the internal reception clock signal of the command/address signal and the reference clock signal in the semiconductor memory device is retained in the DLL circuit, which keeps the generation of the internal reception clock signal for the command/address signal.

34. The calibration method according to claim 32, wherein the third step uses two particular command/address signal lines among command/address signal lines constituting the command/address bus to transmit mutually complementary continuous and alternate inversion signals to the two command/address signal lines, and the fourth step generates internal reception clock signal of the command/address signal lines on the basis of the complementary continuous inversion signals.

35. The calibration method according to claim 32, wherein the memory controller further comprises:
a fifth step of issuing, in the memory controller, a reference DQ data output instruction to the semiconductor memory device;
a sixth step of transmitting, in the semiconductor memory device, a reference DQ data signal associated with the reference DQ data output instruction to a DQ bus; and
a seventh step of counting, in the memory controller, the number of clocks until the reference DQ data signal is received according to the reference clock signal, to retain the count result as the number of delay clocks, and
wherein the memory controller issues a read command, and then receives, from the semiconductor memory device, read data associated the read command as a DQ signal in accordance with the reference clock signal, in consideration of the number of delay clocks.

36. A memory system for use in adaptively performing signal transmission between a semiconductor memory device and a memory controller in accordance with a reference clock signal, wherein the memory controller comprises:
an initializing DQ signal transmitting means for transmitting a continuous and alternate inversion signal as an initializing DQ signal through a DQ bus, with a phase of the initializing DQ signal adjusted to that of the reference clock signal phase, and
wherein the semiconductor memory device comprises: an internal reception clock signal generating means for generating an internal reception clock signal, with a phase difference kept with respect to the initializing DQ signal received, to receive a DQ 25 signal on the basis of the internal reception clock signal.

37. A memory system according to claim 36, wherein the internal reception clock signal generating means comprises a phase difference retaining means for retaining a phase difference between the internal reception clock signal and the reference clock signal in the semiconductor memory device, to continuously generate the internal reception clock signal from the reference clock signal on the basis of a phase difference retained in the phase difference retaining means.

38. The memory system according to claim 36, wherein the initializing DQ signal transmitting means uses two particular DQ lines among DQ lines constituting the DQ bus to transmit mutually complementary continuous and alternate inversion signals as the initializing DQ signals, and
the internal reception clock signal generating means receives the initializing DQ signals that are the complementary continuous and alternate inversion signals through the two particular DQ lines, and generates the internal reception clock signal on the basis of the initializing DQ signals.

39. The memory system according to claim 37, wherein
  the initializing DQ signal transmitting means uses two particular DQ lines among DQ lines constituting the DQ bus to transmit mutually complementary continuous and alternate inversion signals as the initializing DQ signals, and
  the internal reception clock signal generating means receives the initializing DQ signals of the complementary continuous and alternate inversion signals through the two particular DQ lines, and generates the internal reception clock signal on the basis of the initializing DQ signals.

40. A memory system according to claim 36, wherein the memory controller further comprises a DQ data output instruction means for issuing a reference DQ data output instruction to the semiconductor memory device, and a delay clock number retaining means for counting the number of clocks until the reference DQ data
  signal that corresponds to the reference DQ data output instruction is received from the semiconductor memory device by the use of the reference clock signal, to retain the count result as the number of delay clocks, and wherein the semiconductor memory device further comprises a data output means for transmitting the reference DQ data signal to the DQ bus in response to the reference IDQ data output instruction.

41. A memory system according to claim 36, wherein the memory controller comprises an initializing CA signal transmitting means for transmitting a continuous and alternate inversion signal as an initializing command/address (CA) signal to a command/address bus, with a phase of the initializing CA signal adjusted to that of the reference clock signal; and wherein
  the semiconductor memory device comprises a CA internal reception clock signal generating means for generating an internal reception clock signal for the command/address signal such that it has a predetermined phase difference with respect to the initializing command signal or the initializing address signal received by the semiconductor memory device,
  the semiconductor memory device receiving a command/address (CA) signal from the memory controller on the basis of the internal reception clock signal for the command/address signal generated by the CA internal reception clock signal generating means.

42. The memory system according to claim 41, wherein
  the CA internal reception clock signal generating means comprises an additional phase difference retaining means for retaining a phase difference between the internal reception clock signal for the command/address signal and the reference clock signal in the semiconductor memory device,
  the semiconductor memory device continuously generating the internal reception clock signal for the command/address signal from the reference clock signal on the basis of the phase difference retained in the additional phase difference retaining means.

43. The memory system according to claim 41, wherein
  the initializing CA signal transmitting means uses two particular command/address signal lines among command/address signal lines constituting the command/address bus to transmit mutually complementary continuous and alternate inversion signals as the initializing command/address signals, and wherein
  the CA internal reception clock signal generating means receives the initializing command/address signals of the complementary continuous and alternate inversion signals, through the two particular command/address signal lines, and generates the internal reception clock signal for the command/address signal lines on the basis of the initializing command/address signals.

44. The memory system according to claim 42, wherein
  the initializing CA signal transmitting means uses two particular command/address signal lines among command/address signal lines constituting the command/address bus to transmit mutually complementary continuous and alternate inversion signals as the initializing command/address signals, and wherein
  the CA internal reception clock signal generating means receives the initializing command/address signals of the complementary continuous and alternate inversion signals, through the two particular command/address signal lines, and generates the internal reception clock signal for the command/address signal lines on the basis of the initializing command/address signals.

45. A memory system according to claim 41 wherein
  the memory controller further comprises a DQ data output instruction means for issuing a reference DQ data output instruction to the semiconductor memory device, and a delay clock number retaining means for counting the number of clocks until the reference DQ data signal that corresponds to the reference DQ data output instruction is received from the semiconductor memory device according to the reference clock signal, to retain the count result as the number of delay clocks, and wherein
  the semiconductor memory device further comprises a data output means for transmitting the reference DQ data signal through the DQ bus in response to the reference DQ data output instruction.

46. The memory system according to claim 45, wherein
  the memory controller receives the DQ signal transmitted through DQ bus from the semiconductor memory device according to the reference clock signal in consideration of the number of the delay clocks.

47. The memory system according to claim 36, wherein a clock signal line for transmitting the reference clock signal is provided for the DQ lines of each byte or word.

48. The memory system according to claim 47, comprising a parity DQ bit line for each byte.

49. A calibration method for use in adaptively performing signal transmission in a memory system which has a semiconductor memory device and a memory controller each of which is operable as either a sending apparatus or a receiving apparatus and the other of which is operable as either a receiving apparatus or a sending apparatus, the signal transmission being performed by the use of a single reference clock signal, the calibration method being for calibrating the signal transmission between the sending apparatus and the receiving apparatus and comprising:
  a first step of transmitting, in the sending apparatus, a continuous and alternate inversion signal synchronized with the reference clock signal; and
  a second step of generating, in the receiving apparatus, an internal reception clock signal on the basis of the continuous and alternate inversion signal,
  wherein the receiving apparatus is adapted to receive the signal transmitted from the sending apparatus on the basis of the internal reception clock signal.

* * * * *